US012047522B2

(12) United States Patent
Kim et al.

(10) Patent No.: US 12,047,522 B2
(45) Date of Patent: Jul. 23, 2024

(54) ELECTRONIC DEVICE INCLUDING CIRCUIT BOARD PLACED ADJACENT TO FRAME MADE OF CONDUCTIVE MATERIAL

(71) Applicant: Samsung Electronics Co., Ltd., Suwon-si (KR)

(72) Inventors: Sanguk Kim, Suwon-si (KR); Jongdoo Kim, Suwon-si (KR); Hyoseok Na, Suwon-si (KR); Daeseung Park, Suwon-si (KR); Wanjae Ju, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 154 days.

(21) Appl. No.: 17/673,216

(22) Filed: Feb. 16, 2022

(65) Prior Publication Data

US 2022/0311845 A1  Sep. 29, 2022

Related U.S. Application Data

(63) Continuation of application No. PCT/KR2022/001903, filed on Feb. 8, 2022.

(30) Foreign Application Priority Data

Mar. 23, 2021  (KR) ........................ 10-2021-0037377

(51) Int. Cl.
   *H05K 5/00*  (2006.01)
   *H04M 1/02*  (2006.01)
(52) U.S. Cl.
   CPC ....... *H04M 1/0249* (2013.01); *H04M 1/0216* (2013.01)

(58) Field of Classification Search
   None
   See application file for complete search history.

(56) References Cited

U.S. PATENT DOCUMENTS

| 8,350,792 B2 | 1/2013 | Igeta et al. |
| 8,411,462 B2 | 4/2013 | Jang et al. |

(Continued)

FOREIGN PATENT DOCUMENTS

| JP | 6946466 B2 | 10/2021 |
| KR | 10-1373519 B1 | 3/2014 |

(Continued)

OTHER PUBLICATIONS

International Search Report with Written Opinion and English translation dated May 19, 2022; International Appln. No. PCT/KR2022/001903.

(Continued)

*Primary Examiner* — Anthony Q Edwards
*Assistant Examiner* — Rashen E Morrison
(74) *Attorney, Agent, or Firm* — Jefferson IP Law, LLP

(57) ABSTRACT

An electronic device is provided. The electronic device includes a first mechanical element, a second mechanical element moving with respect to the first mechanical element, a frame including a first frame formed of a conductive material and coupled to the first mechanical element and a second frame formed of a conductive material and coupled to the second mechanical element, a segmentation part formed at the frame to segment each of the first frame and the second frame into a plurality of parts, and a first substrate member which includes a first part and a second part spaced apart from each other, and a first bending part for bendably connecting the first part and the second part and is disposed to move together with at least one of the first mechanical element and the second mechanical element, wherein a (Continued)

plurality of wires arranged at the first substrate member may be arranged not to pass through a first area which is an area of the first bending part of the first substrate member and is adjacent to the segmentation part.

20 Claims, 18 Drawing Sheets

(56) References Cited

U.S. PATENT DOCUMENTS

| | | | | |
|---|---|---|---|---|
| 10,581,153 | B2* | 3/2020 | Edwards | H04M 1/02 |
| 10,804,617 | B2* | 10/2020 | Zhou | H01Q 1/243 |
| 11,228,345 | B1* | 1/2022 | Wang | H04B 1/40 |
| 2012/0176279 | A1 | 7/2012 | Merz et al. | |
| 2017/0141820 | A1 | 5/2017 | Kim et al. | |
| 2017/0142241 | A1 | 5/2017 | Kim et al. | |
| 2017/0287992 | A1 | 10/2017 | Kwak et al. | |
| 2019/0036210 | A1 | 1/2019 | Kim et al. | |
| 2019/0140342 | A1 | 5/2019 | Lim et al. | |
| 2020/0136243 | A1 | 4/2020 | Shin et al. | |
| 2020/0203804 | A1 | 6/2020 | Khripkov et al. | |
| 2020/0266524 | A1 | 8/2020 | Yoon et al. | |
| 2020/0267839 | A1 | 8/2020 | Woo et al. | |
| 2020/0383247 | A1 | 12/2020 | Jin et al. | |
| 2021/0168230 | A1* | 6/2021 | Baker | G06F 1/1698 |

FOREIGN PATENT DOCUMENTS

| | | |
|---|---|---|
| KR | 10-2017-0056292 A | 5/2017 |
| KR | 10-2017-0111827 A | 10/2017 |
| KR | 10-2017-0116262 A | 10/2017 |
| KR | 10-2017-0120985 A | 11/2017 |
| KR | 10-1958789 B1 | 7/2019 |
| KR | 10-2020-0046246 A | 5/2020 |
| KR | 10-2020-0101310 A | 8/2020 |

OTHER PUBLICATIONS

Extended European Search Report dated May 24, 2024, issued in European Patent Application No. 22775896.8.

* cited by examiner

[a]

(b)

ELECTRONIC DEVICE INCLUDING CIRCUIT BOARD PLACED ADJACENT TO FRAME MADE OF CONDUCTIVE MATERIAL

CROSS-REFERENCE TO RELATED APPLICATION(S)

This application is a continuation application, claiming priority under § 365(c), of an International application No. PCT/KR2022/001903, filed on Feb. 8, 2022, which is based on and claims the benefit of a Korean patent application number 10-2021-0037377, filed on Mar. 23, 2021, in the Korean Intellectual Property Office, the disclosure of which is incorporated by reference herein in its entirety.

TECHNICAL FIELD

The disclosure relates to an electronic device including a substrate member disposed adjacent to a frame made of a conductive material such as a metal.

BACKGROUND ART

There have been increasing demands for electronic devices having exterior metals applied thereto in line with design trends of portable electronic devices.

In the case of an electronic device having a frame made of a conductive material as the exterior thereof, there may be a restriction on disposition of an antenna inside the frame. According to a scheme applied to address this, a frame made of a conductive material is used as an antenna radiator such that a multiband antenna is implemented, and the radiation performance thereof is secured.

The above information is presented as background information only to assist with an understanding of the disclosure. No determination has been made, and no assertion is made, as to whether any of the above might be applicable as prior art with regard to the disclosure.

DETAILED DESCRIPTION OF THE INVENTION

Technical Problem

In order to transmit or receive communication signals in various bands, a frame may be segmented into multiple parts. For example, an insulating material having a very low level of conductivity or a low dielectric constant may be disposed between parts of a frame such that the frame is separated into multiple parts that are electrically segmented.

At least a part of the segmented frame may operate as an antenna radiator having a designated resonance frequency. However, a coupling phenomenon may occur between the frame and an electric element disposed adjacent to the insulating material. If such a coupling phenomenon occurs, the resonance frequency of the frame may be changed. This may reduce the communication signal radiation or reception efficiency of the antenna including at least a part of the frame.

Aspects of the disclosure are to address at least the above-mentioned problems and/or disadvantages and to provide at least the advantages described below. Accordingly, an aspect of the disclosure is to provide an electronic device having a structure such that a segmented part and an electric element can be disposed to be spaced apart from each other.

Technical Solution

Additional aspects will be set forth in part in the description which follows and, in part, will be apparent from the description, or may be learned by practice of the presented embodiments.

In accordance with an aspect of the disclosure, an electronic device is provided. The electronic device includes a frame formed of a conductive material, at least a part the frame forming a lateral exterior of the electronic device, a segmentation part formed at the frame so as to segment the frame into a plurality of parts and a first substrate member comprising a first part and a second part which are spaced apart from each other, and a first bending part configured to bendably connect the first part and the second part, wherein a plurality of wires arranged in the first substrate member is arranged not to pass through a first area which is an area of the first bending part of the first substrate member and is adjacent to the segmentation part.

In accordance with another aspect of the disclosure, an electronic device is provided. The electronic device includes a first mechanical element, a second mechanical element configured to move with respect to the first mechanical element, a frame including a first frame formed of a conductive material and coupled to the first mechanical element and a second frame formed of a conductive material and coupled to the second mechanical element, a segmentation part formed at the frame to segment each of the first frame and the second frame into a plurality of parts, and a first substrate member which includes a first part and a second part spaced apart from each other, and a first bending part for bendably connecting the first part and the second part and is disposed to move together with at least one of the first mechanical element and the second mechanical element, wherein a plurality of wires arranged at the first substrate member are arranged not to pass through a first area which is an area of the first bending part of the first substrate member and is adjacent to the segmentation part.

Advantageous Effects

According to various embodiments disclosed herein, a coupling phenomenon occurring in a frame due to an electric element adjacent to an insulating material may be alleviated or removed such that the frame made of a conductive material can radiate or receive communication signals with a designated quality.

Other aspects, advantages, and salient features of the disclosure will become apparent to those skilled in the art from the following detailed description, which, taken in conjunction with the annexed drawings, discloses various embodiments of the disclosure

BRIEF DESCRIPTION OF DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

MODE FOR CARRYING OUT THE INVENTION

Figure 1:
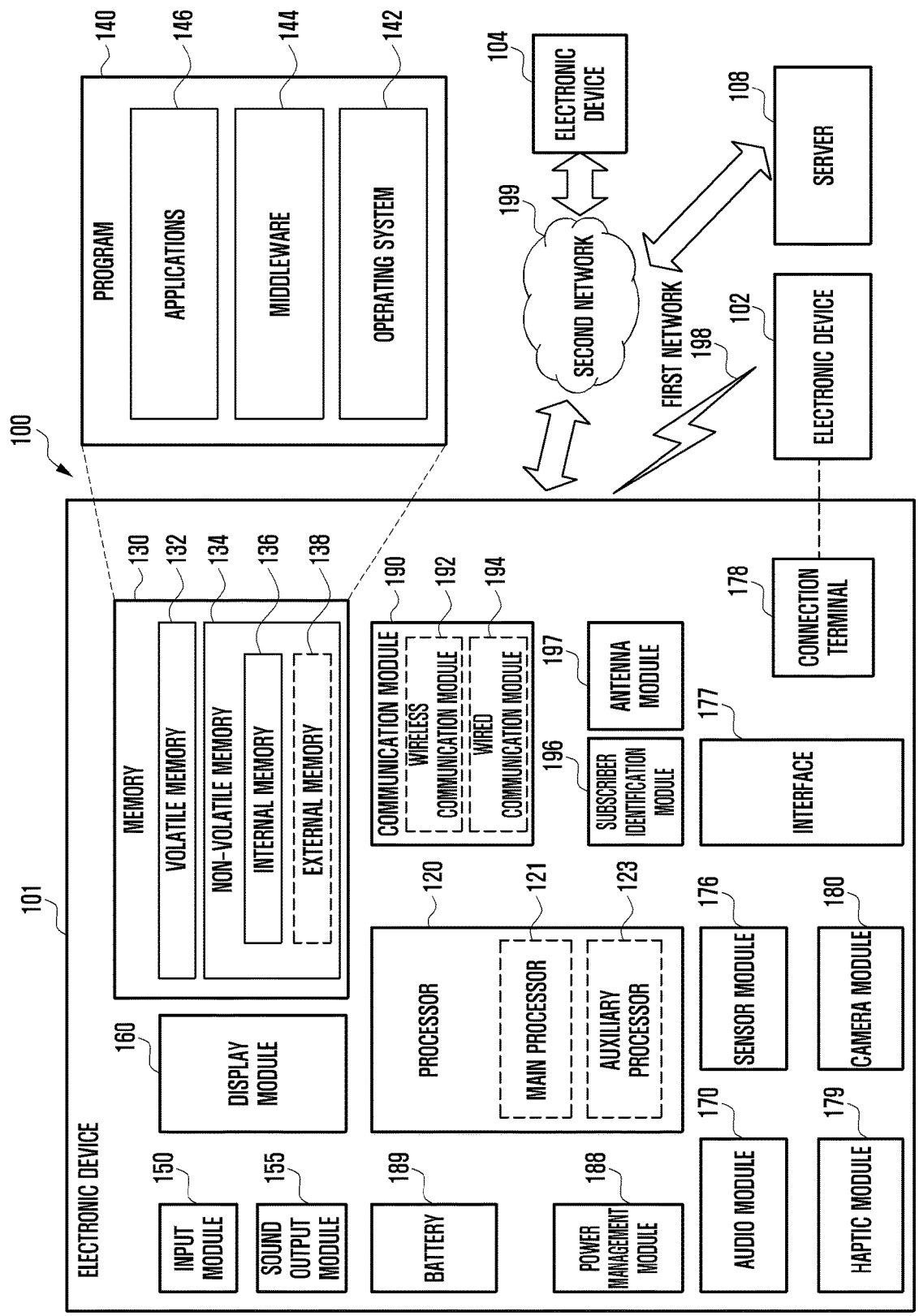
FIG. 1 is a block diagram of an electronic device in a network environment according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It should be appreciated that various embodiments of the disclosure and the terms used therein are not intended to limit the technological features set forth herein to particular embodiments and include various changes, equivalents, or replacements for a corresponding embodiment.

With regard to the description of the drawings, similar reference numerals may be used to refer to similar or related elements. It is to be understood that a singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

FIG. 1 is a block diagram illustrating an electronic device 101 in a network environment 100 according to an embodiment of the disclosure. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include at least one of internal memory 136 or external memory 138.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
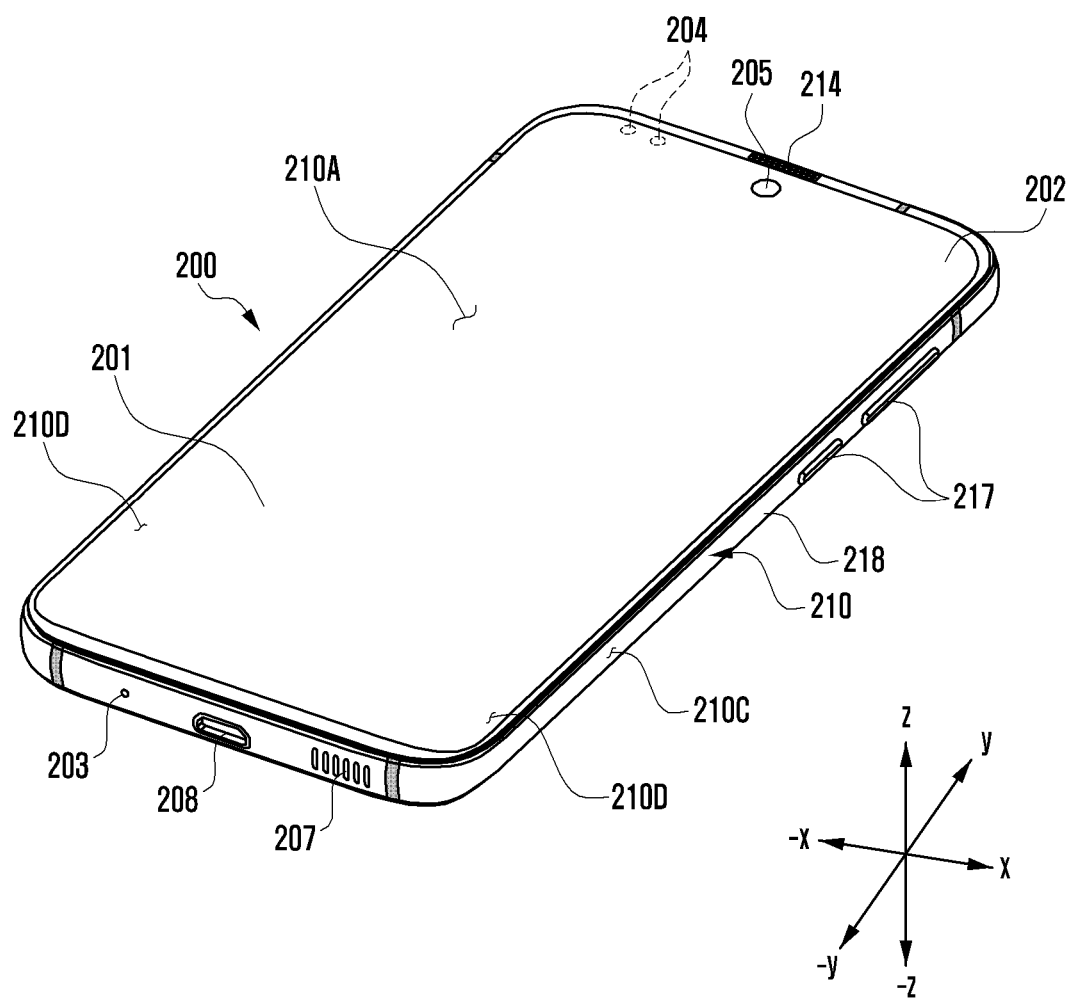
FIG. 2A is a perspective view of a front surface of an electronic device according to an embodiment of the disclosure.
Figure 2B:
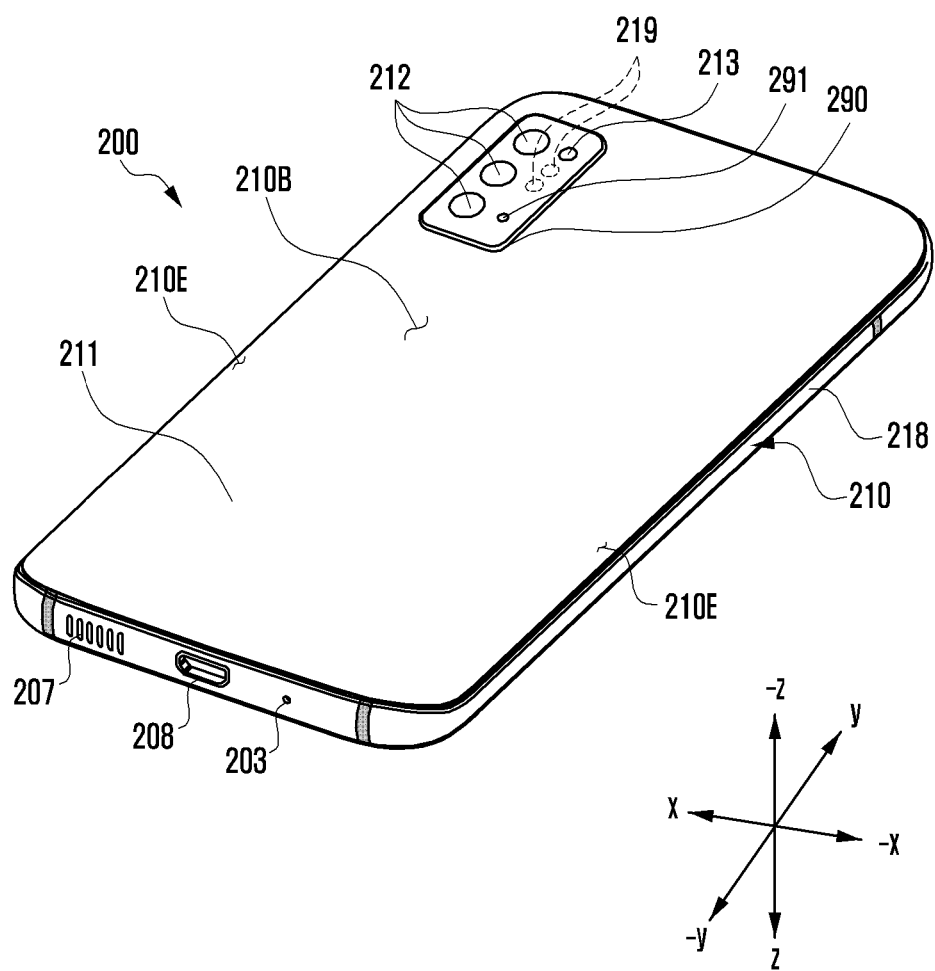
FIG. 2B is a perspective view of a rear surface of the electronic device in FIG. 2A according to an embodiment of the disclosure.

FIG. 2A illustrates a perspective view showing a front surface of a mobile electronic device 200 according to an embodiment of the disclosure, and FIG. 2B illustrates a perspective view showing a rear surface of the mobile electronic device 200 shown in FIG. 2A according to an embodiment of the disclosure.

The electronic device 200 described below may include at least one component of the electronic device 101.

Referring to FIGS. 2A and 2B, the mobile electronic device 200 may include a housing 210 that includes a first surface (or front surface) 210A, a second surface (or rear surface) 210B, and a lateral surface 210C that surrounds a space between the first surface 210A and the second surface 210B. The housing 210 may refer to a structure that forms a part of the first surface 210A, the second surface 210B, and the lateral surface 210C. The first surface 210A may be formed of a front plate 202 (e.g., a glass plate or polymer plate coated with a variety of coating layers) at least a part of which is substantially transparent. The second surface 210B may be formed of a rear plate 211 which is substantially opaque. The rear plate 211 may be formed of, for example, coated or colored glass, ceramic, polymer, metal (e.g., aluminum, stainless steel (STS), or magnesium), or any combination thereof. The lateral surface 210C may be formed of a lateral bezel structure (or "lateral member") 218 which is combined with the front plate 202 and the rear plate 211 and includes a metal and/or polymer. The rear plate 211 and the lateral bezel structure 218 may be integrally formed and may be of the same material (e.g., a metallic material such as aluminum).

The front plate 202 may include two first regions 210D disposed at long edges thereof, respectively, and bent and extended seamlessly from the first surface 210A toward the rear plate 211. Similarly, the rear plate 211 may include two second regions 210E disposed at long edges thereof, respectively, and bent and extended seamlessly from the second surface 210B toward the front plate 202. The front plate 202 (or the rear plate 211) may include only one of the first regions 210D (or of the second regions 210E). The first regions 210D or the second regions 210E may be omitted in part. When viewed from a lateral side of the mobile electronic device 200, the lateral bezel structure 218 may have a first thickness (or width) on a lateral side where the first region 210D or the second region 210E is not included, and may have a second thickness, being less than the first thickness, on another lateral side where the first region 210D or the second region 210E is included.

The mobile electronic device 200 may include at least one of a display 201, an input device 203, audio output devices 207 and 214, sensor modules 204 and 219, camera modules 205 and 212, a key input device 217, an indicator 291, and a connector 208. The mobile electronic device 200 may omit at least one (e.g., the key input device 217 or the indicator 291) of the above components, or may further include other components.

The display 201 may be exposed through a substantial portion of the front plate 202, for example. At least a part of the display 201 may be exposed through the front plate 202 that forms the first surface 210A and the first region 210D of the lateral surface 210C. The display 201 may be combined with, or adjacent to, a touch sensing circuit, a pressure sensor capable of measuring the touch strength (pressure), and/or a digitizer for detecting a stylus pen. At least a part of the sensor modules 204 and 219 and/or at least a part of the key input device 217 may be disposed in the first region 210D and/or the second region 210E.

The input device 203 may include a microphone 203. In a case, the input device may contain a plurality of microphones to sense a sound direction. The audio output devices 207 and 214 may include speakers 297 and 214. The speakers 207 and 214 may include an external speaker 207 and a call receiver 214. In some embodiments, the microphone 203, speakers 207 and 214, and the connector 208 disposed in an internal space of the electronic device 200 or exposed to an external environment through at least one hole. In some embodiments, the microphone 203 and speakers 207 and 214 may use same hole formed on housing 210. In a case, the audio output devices 207 and 214 include a speaker which does not need the hole (e.g., piezo speaker).

The sensor modules 204 and 219 may generate electrical signals or data corresponding to an internal operating state of the mobile electronic device 200 or to an external environmental condition. The sensor modules 204 and 219 may include a first sensor module 204 (e.g., a proximity sensor) and/or a second sensor module (e.g., a fingerprint sensor) disposed on the first surface 210A of the housing 210, and/or a third sensor module 219 (e.g., a heart rate monitor (HRM) sensor) and/or a fourth sensor module (e.g., a fingerprint sensor) disposed on the second surface 210B of the housing 210. The fingerprint sensor may be disposed on the second surface 210B as well as the first surface 210A (e.g., the display 201) of the housing 210. The electronic device 200 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 205 and 212 may include a first camera device 205 disposed on the first surface 210A of the electronic device 200, and a second camera device 212 and/or a flash 213 disposed on the second surface 210B. The camera module 205 or the camera module 212 may include one or more lenses, an image sensor, and/or an image signal processor. The flash 213 may include, for example, a light emitting diode or a xenon lamp. Two or more lenses (infrared cameras, wide angle and telephoto lenses) and image sensors may be disposed on one side of the electronic device 200.

The key input device 217 may be disposed on the lateral surface 210C of the housing 210. The mobile electronic device 200 may not include some or all of the key input device 217 described above, and the key input device 217 which is not included may be implemented in another form such as a soft key on the display 201.

The indicator 291 may be disposed on at least one of the first surface 210A or the second surface 210B of the housing 210. For example, the indicator 291 may provide status information of the electronic device 200 in an optical form. The indicator 291 may provide a light source associated with the operation of the camera module 205 or camera module 212. The indicator 291 may include, for example, a light emitting diode (LED), an IR LED, or a xenon lamp.

The connector holes 208 and 209 may include a first connector hole 208 adapted for a connector (e.g., a USB connector) for transmitting and receiving power and/or data to and from an external electronic device, and/or a second connector hole 209 adapted for a connector (e.g., an earphone jack) for transmitting and receiving an audio signal to and from an external electronic device.

Some camera modules 205 of camera modules 205 and 212, some sensor modules 204 of sensor modules 204 and 219, or an indicator 291 may be arranged to be exposed through a display 201. For example, the camera module 205, the sensor module 204, or the indicator 291 may be arranged in the internal space of an electronic device 200 so as to be brought into contact with an external environment through an opening of the display 201, which is perforated up to a front plate 202. In another embodiment, some sensor modules 204 may be arranged to perform their functions without being visually exposed through the front plate 202 in the internal space of the electronic device. For example, in this case, an area of the display 201 facing the sensor module may not require a perforated opening.

One or more of the second camera device 212, flash 213, sensor module 219, and indicator 291 may be arranged on the second surface 210B in a camera bump 290.

According to various embodiments, although the electronic device 200 has a bar type or a plate type appearance, the disclosure does not limit the electronic device appearance. For example, the electronic device 200 may be part of a foldable electronic device, slidable electronic device, stretchable electronic device, or rollable electronic device. "The foldable electronic device", "The slidable electronic device", "The stretchable electronic device", or "The rollable electronic device" may mean the electronic device including the display (e.g., the display 330 or FIG. 3) can be deformed so as to capable of folding, wounding, rolling, or at least part can be extended or be stored inside the housing (e.g., the housing 210 of FIG. 2A and FIG. 2B). The display of the foldable electronic device, the slidable electronic device, the stretchable electronic device, or the rollable electronic device can be unfolded to expose more to external according to the user's need.

Figure 3:
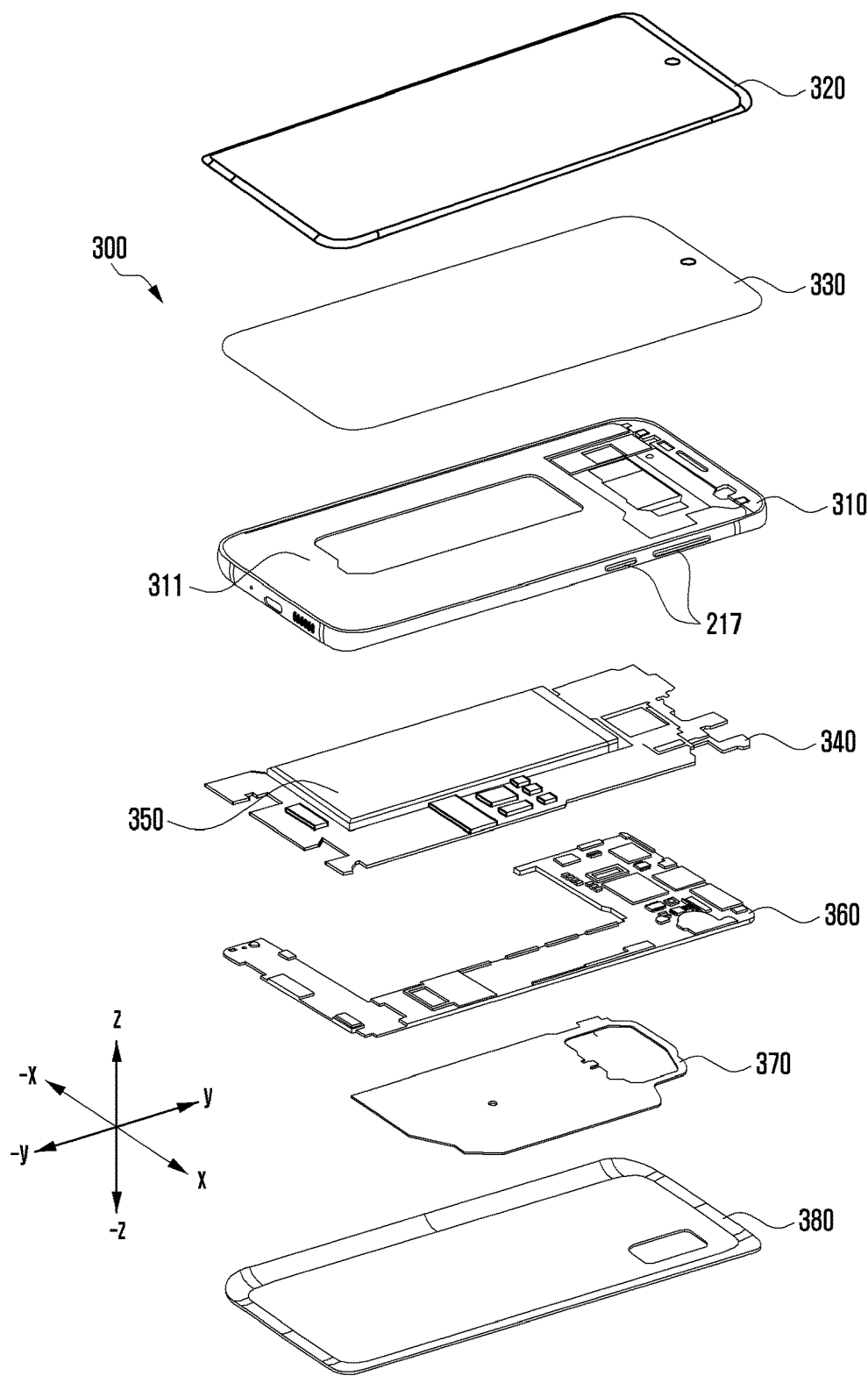
FIG. 3 is an exploded perspective view of the electronic device in FIG. 2A according to an embodiment of the disclosure.

FIG. 3 illustrates an exploded perspective view showing a mobile electronic device 200 shown in FIG. 2A according to an embodiment of the disclosure.

The electronic device 300 of FIG. 3 may be similar to the electronic device 200 of FIG. 2A and FIG. 2B or may include other embodiments of an electronic device.

Referring to FIG. 3, the electronic device 300 may include a lateral bezel structure 310, a first support member 311 (e.g., a bracket), a front plate 320, a display 330, a PCB 340 (e.g., a PCB, FPCB, or radio frequency (RF) PCB (RFPCB)), a battery 350, a second support member 360 (e.g., a rear case), an antenna 370, and a rear plate 380. The electronic device 300 may omit at least one (e.g., the first support member 311 or the second support member 360) of the above components or may further include another component. Some components of the electronic device 300 may be the same as or similar to those of the mobile electronic device 200 shown in FIG. 2A or FIG. 2B, thus, descriptions thereof are omitted below.

The first support member 311 is disposed inside the electronic device 300 and may be connected to, or integrated with, the lateral bezel structure 310. The first support member 311 may be formed of, for example, a metallic material and/or a non-metal (e.g., polymer) material. The first support member 311 may be combined with the display 330 at one side thereof and also combined with the PCB 340 at the other side thereof. On the PCB 340, a processor, a memory, and/or an interface may be mounted. The processor may include, for example, one or more of a CPU, an AP, a GPU, an ISP, a sensor hub processor, or a CP.

The memory may include, for example, volatile memory or non-volatile memory.

The interface may include, for example, a high definition multimedia interface (HDMI), a USB interface, a secure digital (SD) card interface, and/or an audio interface. The interface may electrically or physically connect the electronic device 300 with an external electronic device and may include a USB connector, an SD card/multimedia card (MMC) connector, or an audio connector.

The battery 350 is a device for supplying power to at least one component of the electronic device 300, and may include, for example, a non-rechargeable primary battery, a rechargeable secondary battery, or a fuel cell. At least a part of the battery 350 may be disposed on substantially the same plane as the PCB 340. The battery 350 may be integrally disposed within the electronic device 300, and may be detachably disposed from the electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication with an external device, or transmit and receive power required for charging wirelessly. An antenna structure may be formed by a part or combination of the lateral bezel structure 310 and/or the first support member 311.

Figure 4A:
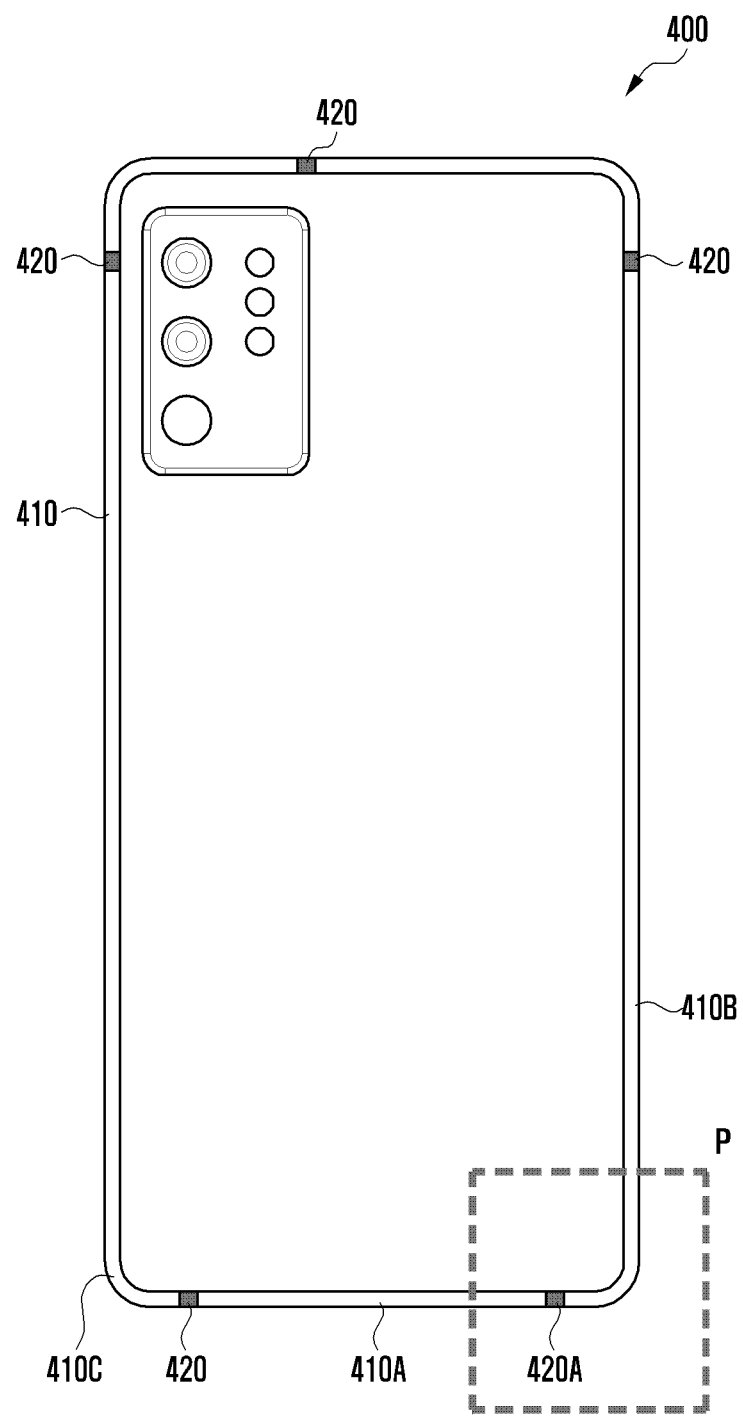
FIG. 4A illustrates an electronic device according to an embodiment of the disclosure.

FIG. 4A is a view of an electronic device according to an embodiment of the disclosure.

An electronic device 400 illustrated in FIG. 4A may be an example of the electronic device 101 in FIG. 1 and/or the electronic device 200 in FIG. 2A described above.

Referring to FIG. 4A, a part of an exterior of the electronic device 400 may be formed by a frame 410 (e.g., a side bezel structure 218 in FIG. 2A) surrounding a side surface (e.g., a side surface 210C in FIG. 2A) of the electronic device 400. In an embodiment, the frame 410 may be formed of a conductive material such as a metal material. For example, the frame 410 may be formed of a metal material including aluminum (Al).

According to various embodiments disclosed herein, the electronic device 400 may be the electronic device 400 using the frame 410 formed of a conductive material as an antenna. The frame 410 and a communication module (e.g., a communication module 180 in FIG. 1) of the electronic device 400 are electrically connected so that a communication signal can be sent or transmitted through at least a part of the frame 410. In an embodiment, at least a part of the frame 410 may be electrically connected to a communication circuit for processing an RF signal. The electronic device 400 may include various antenna-related circuits such as a matching circuit for impedance matching and a switching circuit allowing at least a part of the frame 410 functioning as a radiator of an antenna to correspond to broadband characteristics. For example, the matching circuit may be a circuit including a passive element such as an inductor or a capacitor to match an impedance. The switching circuit may short-circuit parts of the frame which are electrically opened to each other or change a connection route to change the electrical length of an antenna. The matching circuit and the switching circuit of a circuit part described above are not limitedly construed by those names, and may be understood as a circuit including an element which can perform the corresponding function. For example, the switching circuit may be named a switching circuit part and the matching circuit may be named a variable element part. In an embodiment, at least a part of a communication part connected to the frame 410 may be disposed at a flexible PCB radio frequency cable (FRC). The FRC may be electrically connected to the frame so that the communication circuit can be electrically connected to the frame 410.

As illustrated in FIG. 4A, the frame 410 may include a plurality of parts (e.g., a first frame 410A, a second frame 410B, or a third frame 410C). The frame 410 may have at least one segmentation part (e.g., a segmentation part 411 in FIG. 7A) formed therein. The frame 410 may be segmented into a plurality of parts by the segmentation part. In an embodiment, an insulating member 420 may be disposed at the segmentation part of the frame 410. The insulating member 420 may be understood, for example, as a material having low conductivity or a material having low permittivity. A part segmented by the insulating member 420 may be electrically separated. In a case where a frame is used as an antenna of the electronic device, a resonant frequency may be determined depending on the physical length of the frame 410. In an embodiment, the frame 410 may be segmented into the first frame 410A, the second frame 410B, or the third frame 410C which have different lengths. In an embodiment, the first frame 410A, the second frame 410B, or the third frame 410C may respectively operate as radiators of an antenna, which have different resonant frequencies. For example, when the first frame 410A and the second frame 410B, or the third frame 410C having different resonant frequencies are used as radiators of an antenna, communications in various frequency bands (e.g., short-range communication, or long-distance communication) may be possible.

Various electronic components transmitting an electrical signal or driven by receiving an electrical signal may be arranged in the electronic device 400. Hereinafter, the components are named "electrical object". The electrical object may be formed of a conductive material or may include at least one conductive material. In some cases, when the electrical object is disposed at a part adjacent to the segmentation part for segmenting the frame 410 into a plurality of parts, a coupling phenomenon may occur between the first frame 410A and the second frame 410B by the segmentation part and the electrical object. In the following description, for convenience of understanding, it will be described that the insulating member 420 is disposed in the segmentation part. However, the insulating member 420 may be omitted. When the insulating member 420 is omitted, it may be understood by replacing the insulating member 420 described hereinbelow with the segmentation part which is a part segmenting the frame 410.

For example, the first frame 410A and the second frame 410B may operate as radiators of antennas having resonant frequencies, respectively. When a coupling phenomenon occurs between the first frame 410A and the second frame 410B, a resonant frequency of the first frame 410A or the second frame 410B may be changed. As a result, the efficiency in transmission or reception of a communication signal through the first frame 410A and the second frame 410B may be decreased.

For this reason, it may be preferable not to dispose an electrical object around a first insulating member 420A by which the first frame 410A and the second frame 410B are segmented. However, since the inner space of the electronic device 400 is limited, there may be a limit in spacing an electrical object apart from the insulating member 420 including the first insulating member 420A therearound. The first insulating member 420A may be substantially identical to the insulating member 420. In another example, the number of the insulating member 420 displayed in FIG. 4A is one embodiment and the number of the insulating member 420 may not be limited.

Figure 4B:
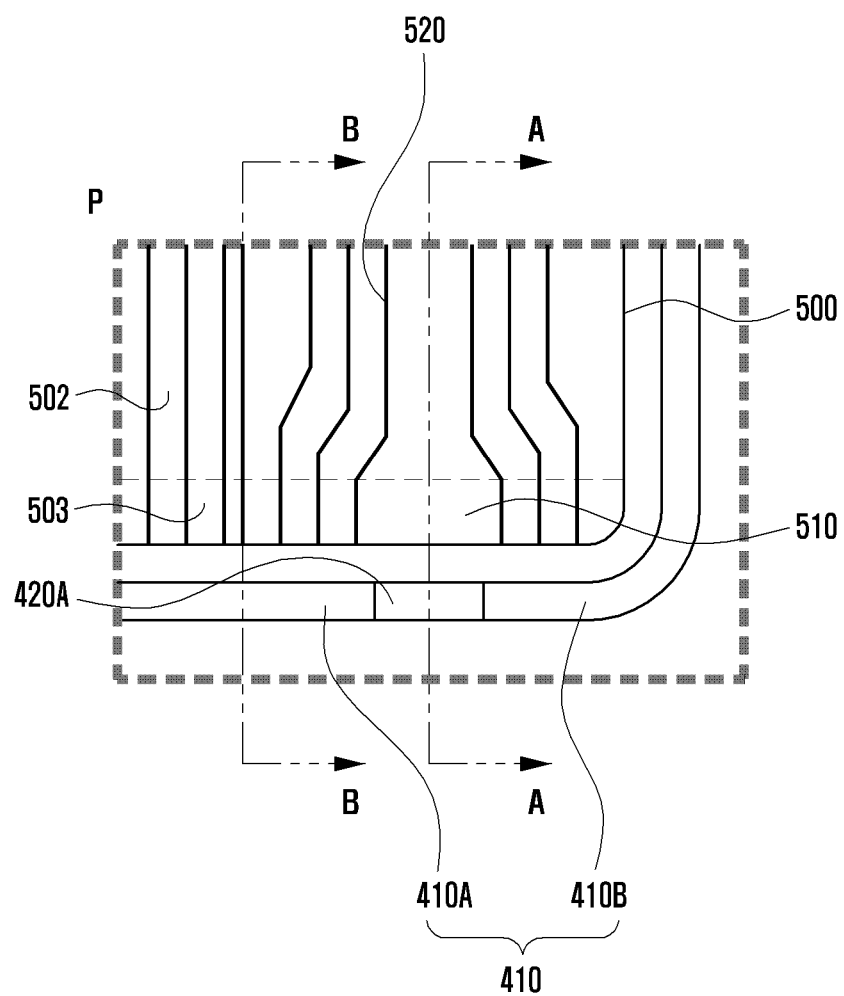
FIGS. 4B and 4C are diagrams illustrating the interior of an area P in FIG. 4A according to various embodiments of the disclosure.
Figure 4C:
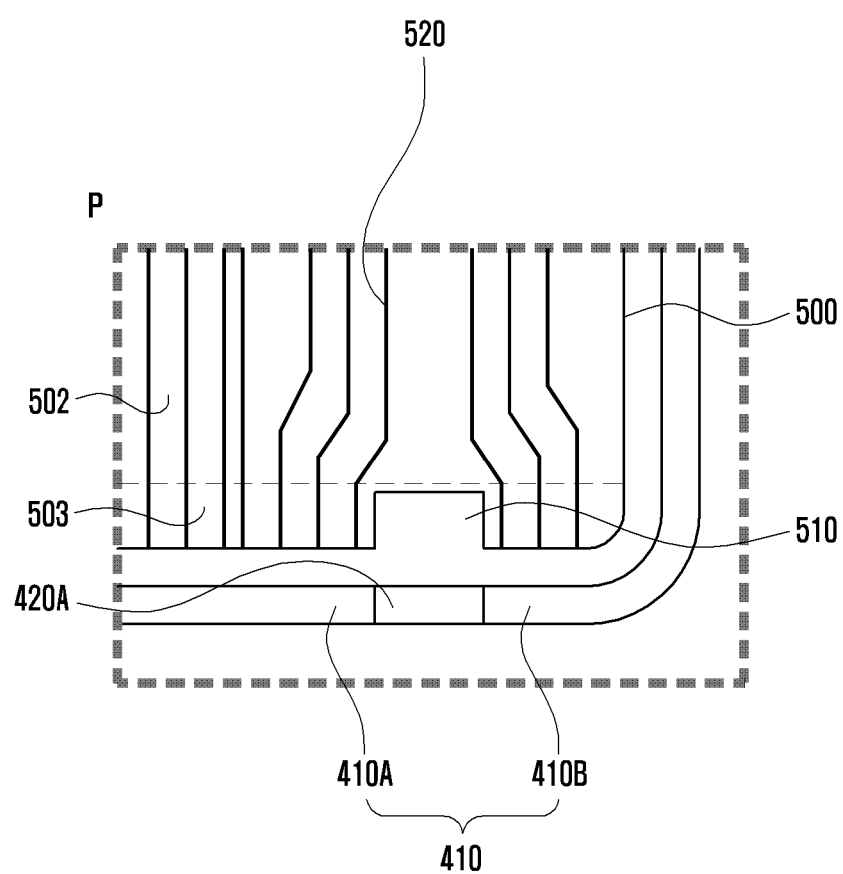
Figure 5A:
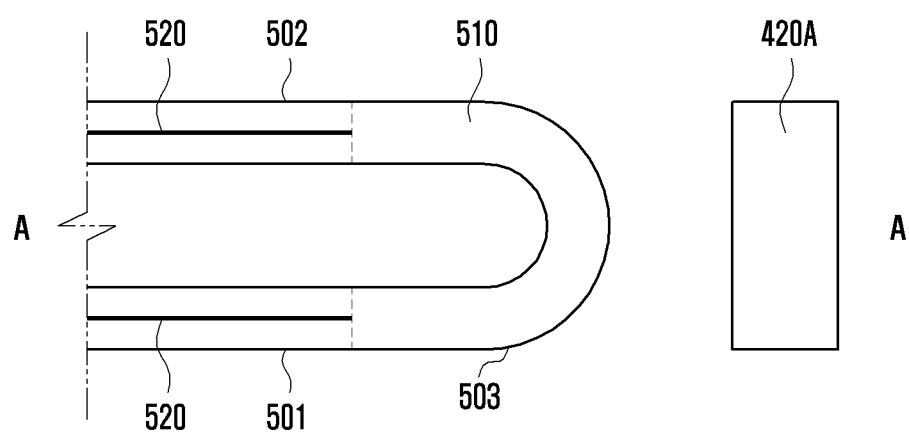
FIG. 5A is a cross-sectional view taken along line A-A illustrated in FIG. 4B according to an embodiment of the disclosure.
Figure 5B:
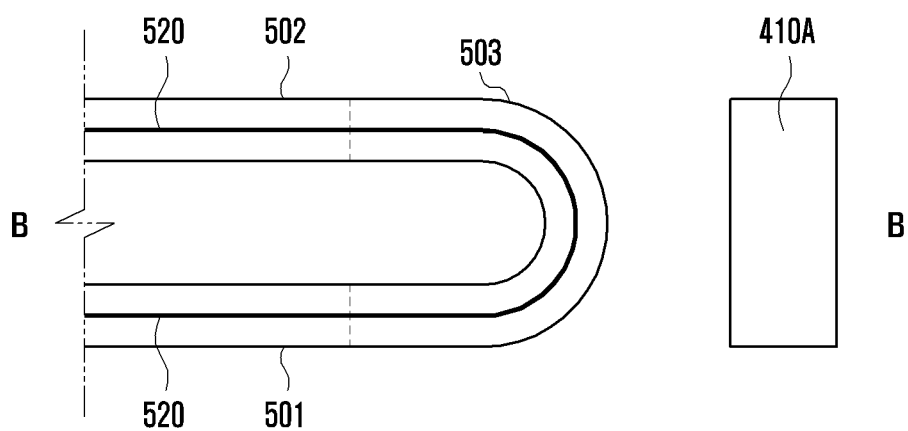
FIG. 5B is a cross-sectional view taken along line B-B illustrated in FIG. 4B according to an embodiment of the disclosure.

FIGS. 4B and 4C are diagrams illustrating the interior of an area P in FIG. 4A according to various embodiments of the disclosure. FIG. 5A is a cross-sectional view taken along line A-A illustrated in FIG. 4B according to an embodiment of the disclosure. FIG. 5B is a cross-sectional view taken along line B-B illustrated in FIG. 4B according to an embodiment of the disclosure.

Referring to FIG. 4B, the first frame 410A and the second frame 410B may be segmented by the first insulating member 420A. A first substrate member 500 corresponding to an electrical object may be disposed at the part adjacent to the first insulating member 420A. A plurality of wires 520 formed of a conductive material may be disposed on the first substrate member 500. In an embodiment, the first substrate member 500 may be a flexible PCB manufactured from a flexible material to be bendable.

For example, the first substrate member 500 may include a first part 501, a second part 502, or a first bending part 503. FIG. 4B illustrates a division line for convenience of description of the first part 501, the second part 502, and the first bending part 503, but this is merely a virtual line. The first part 501, the second part 502, and the first bending part 503 are merely for conceptually describing a part of the first substrate member 500, and it does not mean that the first substrate member 500 is physically segmented into the first part 501, the second part 502 and the first bending part 503. The second part 502 may be disposed to be spaced apart from the first part 501. The first bending part 503 may be a part may be partially bent and connect the first part 501 and the second part 502. Referring to FIG. 5A and FIG. 5B, the first bending part 503 may be bent at a part adjacent to the frame 410 and the first insulating member 420A.

According to various embodiments, a first area 510 of the first substrate member 500 may mean an area of the first bending part 503, which is adjacent to the first insulating member 420A. For example, referring to FIG. 4B, the first area 510 may include an area corresponding to and adjacent to the first insulating member 420A.

In an embodiment, the plurality of wires 520 arranged on the first substrate member 500 may be arranged not to pass through the first area 510. Referring to FIG. 4B, the plurality of wires 520 may be bent at a part adjacent to the first area 510 to extend to avoid the first area 510. Comparing FIG. 5A and FIG. 5B, the wires 520 are not arranged in the first area 510 adjacent to the first insulating member 420A, but the wires 520 may be arranged in the area of the first bending part 503 adjacent to the first frame 410A in the case of FIG. 5B. In an embodiment, the first area 510 may be formed as a fill-cut area.

The wire 520 is a component for transmitting electrical signal and may be formed of a conductive material. When the wire 520 passes through a part adjacent to the insulating member 420, a coupling phenomenon may occur between the first frame 410A and the second frame 410B segmented by the first insulating member 420A. Because of the coupling phenomenon, the efficiency of radiation or reception of the communication signal of the first frame 410A and the second frame 410B may decrease.

In various embodiments disclosed herein, the wire 520 does not pass through the first area 510 adjacent to the first insulating member 420A so that the coupling phenomenon between the first frame 410A and the second frame 410B can be mitigated or resolved. Therefore, the efficiency of transmission or reception of the communication signal of the first frame 410A and the second frame 410B can be secured.

Referring to FIG. 4C, the first area 510 of the first substrate member 500 may be eliminated. In an embodiment, the first area 510 of the first bending part 503 adjacent to the first insulating member 420A may be an opening of the first substrate member 500. Likewise, when the first area 510 adjacent to the first insulating member 420A is eliminated, the wire 520 formed of a conductive material cannot pass through the first area 510, and thus the coupling phenomenon between the first frame 410A and the second frame 410B may be mitigated or resolved.

It is described above that the wire 520 of the first substrate member 500 is disposed not to pass through the first area 510 of the first bending part 503. However, it may be configured such that the wire 520 is not disposed also in a partial area of the first part 501 and the second part 502 of the first substrate member 500 at a part adjacent to the first bending part 503.

Figure 6A:
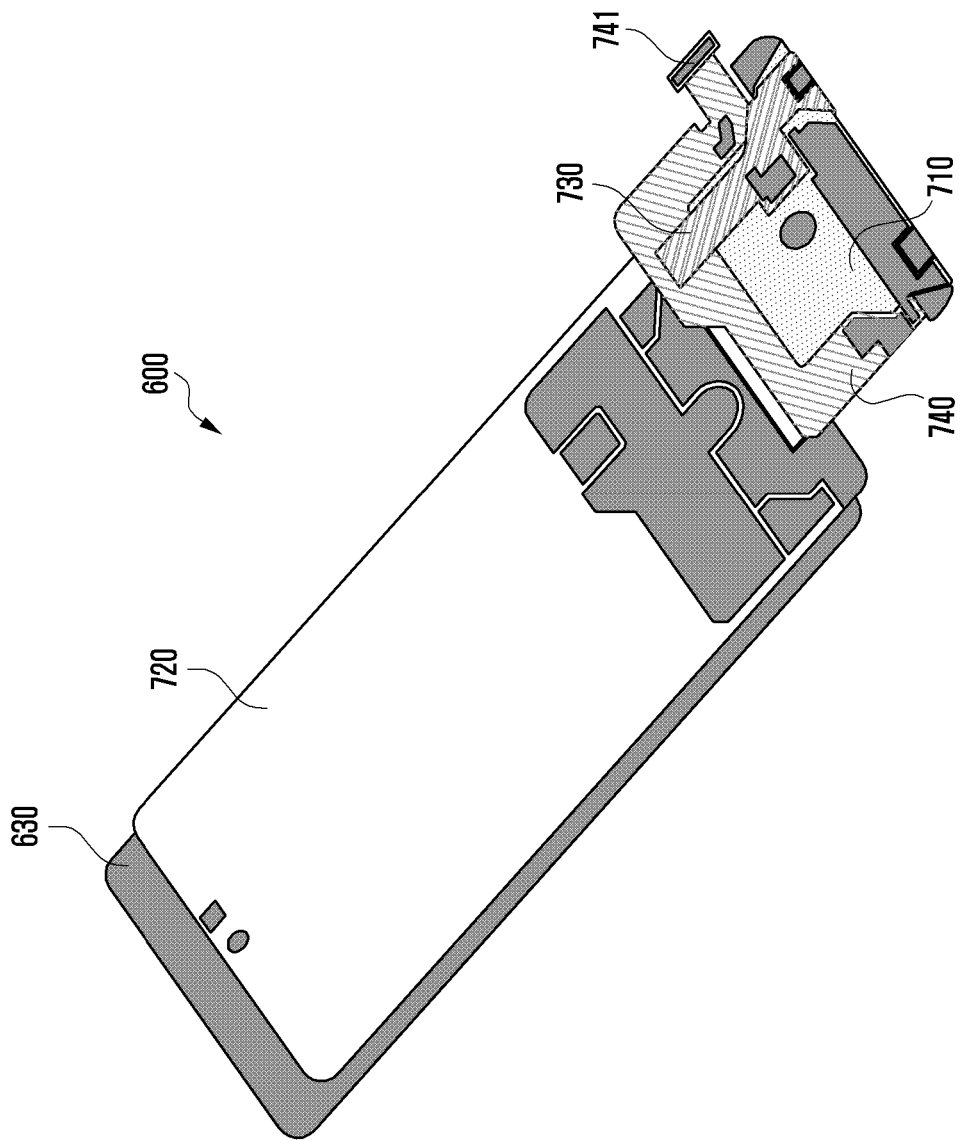
FIG. 6A is a perspective view illustrating a part separated from a display module according to an embodiment of the disclosure.
Figure 6B:
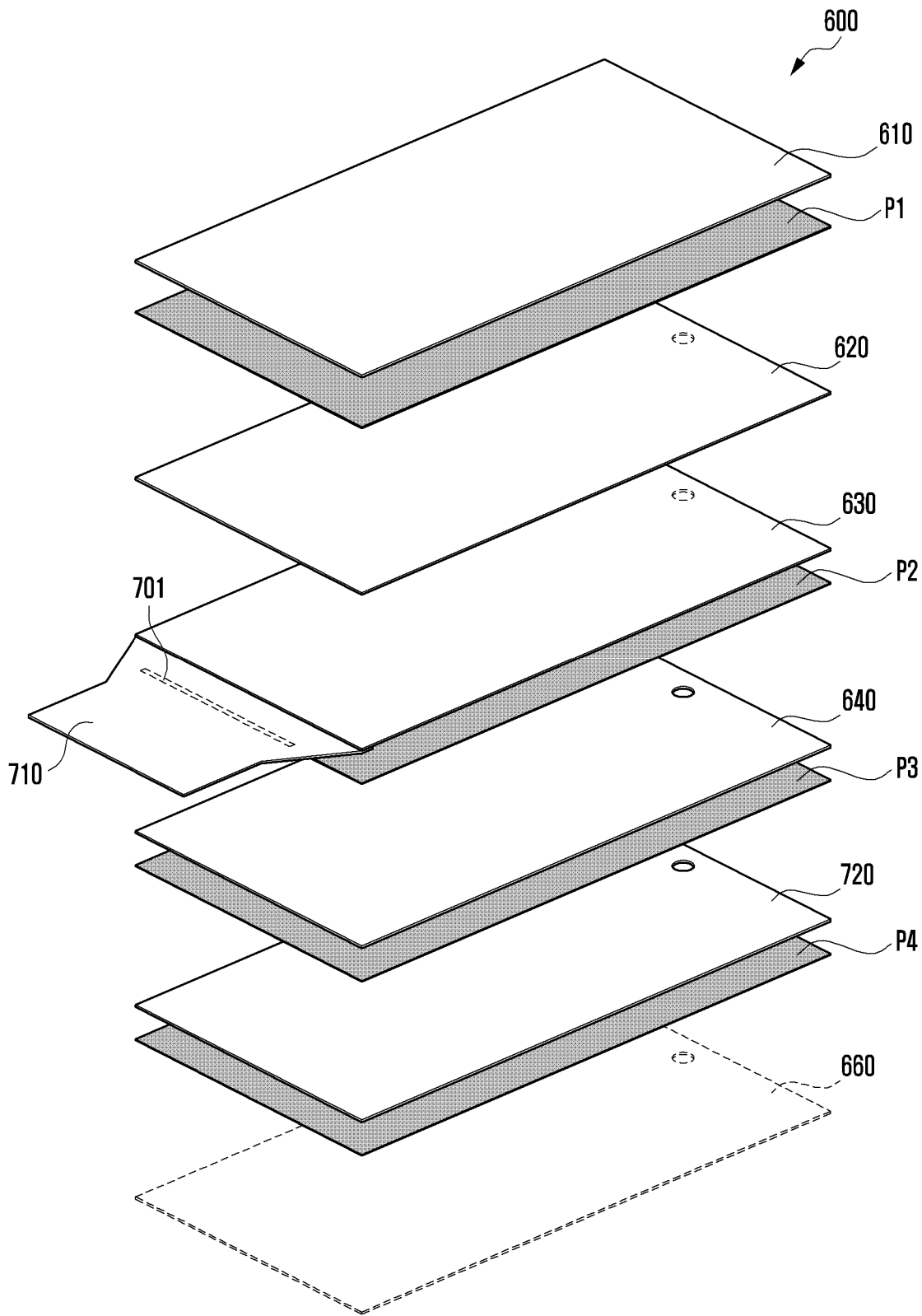
FIG. 6B is an exploded perspective view of a display module according to an embodiment of the disclosure.

FIG. 6A is a perspective view illustrating a part separated from a display module according to an embodiment of the disclosure. FIG. 6B is an exploded perspective view of a display module according to an embodiment disclosure.

According to various embodiments, a first substrate member (e.g., the first substrate member 500 in FIG. 4B) of the disclosure described through FIG. 4B to FIG. 5B may be a component included in a display module 600 (e.g., a display module 160 in FIG. 1). For example, the first substrate member may be a substrate connected to a display panel 630 of the display module 600. Hereinafter, the display module will be described.

Referring to FIG. 6A, the display module 600 according to various embodiments of the disclosure may include an unbreakable (UB) type organic light emitting diodes (OLED) display (e.g., curved display) panel 630. However, the display module 600 is not limited thereto, and may include a flat type display panel 630 in a type of on cell touch active matrix organic light-emitting diode (AMOLED) (OCTA) type.

Referring to FIG. 6B, the display module 600 may include a window layer 610, a polarizer (POL) 620 (e.g., polarization film), the display panel 630, a polymer layer 640, and/or a metal sheet layer 720. In one embodiment, the display panel 630 may include a digitizer 660 disposed between the polymer layer 640 and the metal sheet layer 720 or on the rear surface of the metal sheet layer 720.

According to various embodiments, the window layer 610 may include a glass layer. According to an embodiment, the window layer 610 may include ultra-thin glass (UTG). In one embodiment, the window layer 610 may include polymer. In this case, the window layer 610 may include polyethylene terephthalate (PET) or polyimide (PI). In one embodiment, the window layer 610 may be formed of a plurality of layers including a glass layer and polymer arranged therein.

According to an embodiment, the window layer 610, the polarizer 620, the display panel 630, the polymer layer 640, and the metal sheet layer 720 may be attached through an adhesive (or glue) P1, P2, P3, and P4. For example, the adhesive P1, P2, P3, and P4 may include an optical clear adhesive (OCA), a pressure sensitive adhesive (PSA), a thermal reaction glue, a general glue, or a double-sided tape.

According to various embodiments, the display panel 630 may include a plurality of pixels and a wiring structure (e.g., electrode pattern). According to one embodiment, the polarizer 620 may selectively pass the light generated from a light source of the display panel 630 and vibrating in a predetermined direction. In one embodiment, the display panel 630 and the polarizer 620 may be integrally formed. A touch panel (not illustrated) may be included therein.

According to various embodiments, the polymer layer 640 may be disposed under the display panel 630 to provide a dark background for securing visibility of the display panel 630 and may be formed of a buffer material for buffering action. In one embodiment, the polymer layer 640 may be eliminated or disposed under the metal sheet layer 720 to waterproof the display module 600.

According to one embodiment, the metal sheet layer 720 may include at least one of steel use stainless (SUS) (e.g., stainless steel (STS)), Cu, AI, or metal CLAD (e.g., a stacked member in which SUS and AI are alternately arranged). In one embodiment, the metal sheet layer 720 may include other alloy materials. In one embodiment, the metal sheet layer 720 may be helpful to reinforce the strength of the electronic device (e.g., the electronic device 200 in FIG. 2A), may block ambient noise, and may be used for dissipating heat emitted from an ambient heat-emitting component.

According to various embodiments, the display module 600 may be disposed under the metal sheet layer 720 and may include the digitizer 660 as a detection member for receiving an input of an electronic pen (e.g., stylus). For example, the digitizer 660 may include a conductive member disposed on a dielectric substrate to detect a resonance frequency applied from the electronic pen using an electromagnetic induction method.

According to various embodiments, the display module 600 may include at least one functional member (not illustrated) disposed between the polymer layer 640 and the metal sheet layer 720 or under the metal sheet layer 720. According to one embodiment, a functional member may include a graphite sheet for heat dissipation, an added display, a force touch FPCB, a fingerprint sensor FPCB, a communication antenna radiator, or a conductive/non-conductive tape.

According to various embodiments, the display module 600 may include a first substrate member 710 (e.g., the first substrate member 500 in FIG. 4B) disposed by being folded from the display panel 630 to at least partial area of the rear surface of the display module 600. According to one embodiment, the first substrate member 710 may be electrically connected to the display panel 630. In an embodiment, the first substrate member 710 may include a display driver IC (DDI) or a touch display driver IC (TDDI). The display module 600 may include a chip on film (COF) structure where the DDI 701 is disposed in the first substrate member 710 electrically connected to the display panel 630. In another embodiment, the display module 600 may include a chip on panel or chip on plastic (COP) structure where the DDI 701 is disposed in a part of the display panel 630.

According to various embodiments, the first substrate member 710 may be electrically connected to a third substrate member 740. Various elements related to the operation of the display module 600 may be arranged at the third substrate member 740. For example, a flash memory for a display, an ESD preventing diode, a pressure sensor, or a manual element such as a decap may be arranged at the third substrate member 740. The third substrate member 740 may include a connector 741. In an embodiment, the connector 741 may be formed integrally with the third substrate member 740. The connector 741 may extend from the third substrate member 740 in one direction and be electrically connected to a PCB (e.g., a PCB 340 in FIG. 3) of the electronic device. The connector 741 may be connected to the PCB in various ways. For example, the connector 741 may be connected in various ways such as bonding by using soldering, a clip, a socket, or a conductive adhesive.

According to various embodiments, the display module 600 may include a second substrate member 730 electrically connected to the display panel 630. The second substrate member 730 may deliver a signal according to a touch input of the display panel 630.

Figure 7A:
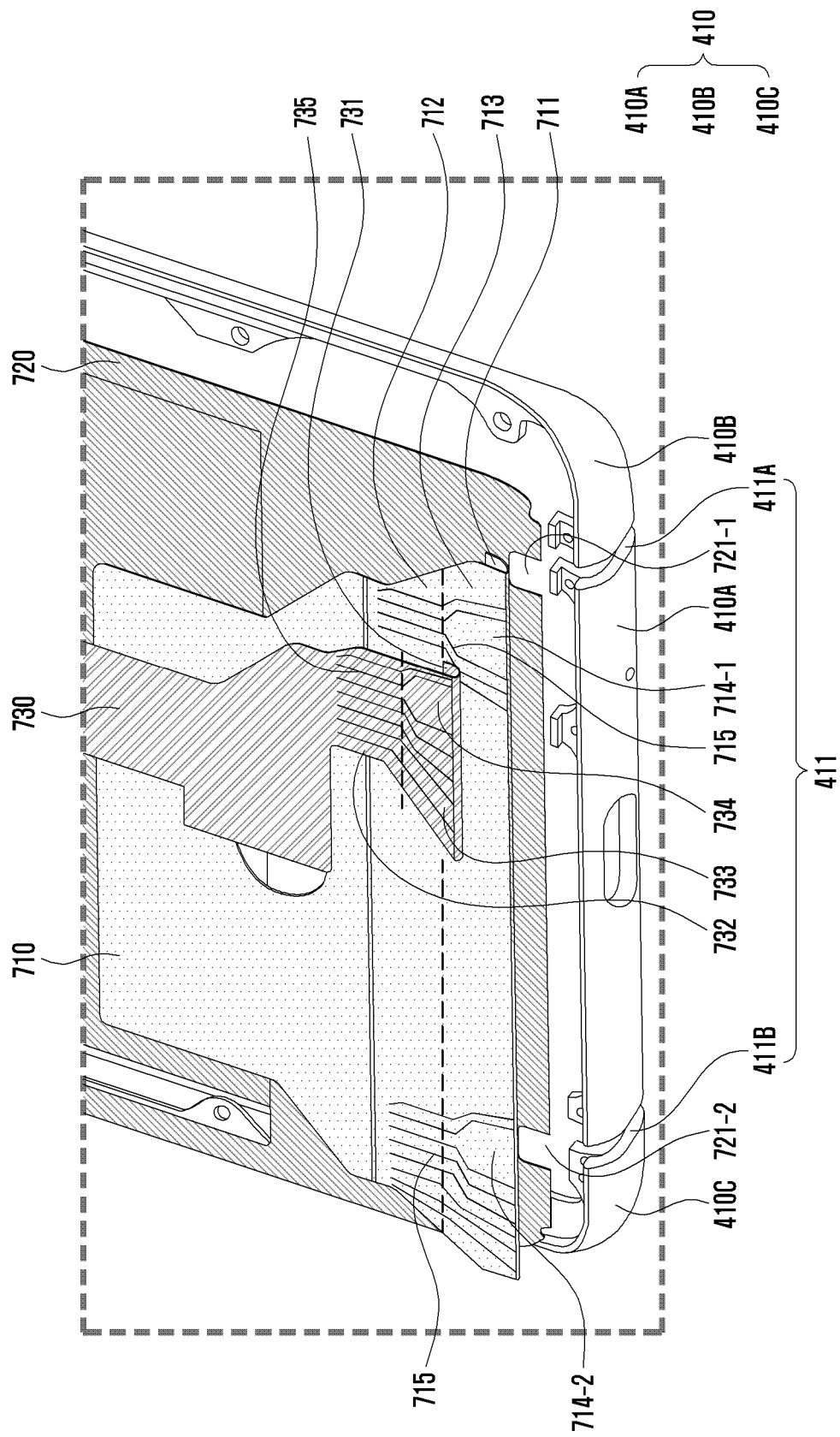
FIG. 7A is an exploded perspective view of a display module at a part adjacent to a frame according to an embodiment of the disclosure.
Figure 7B:
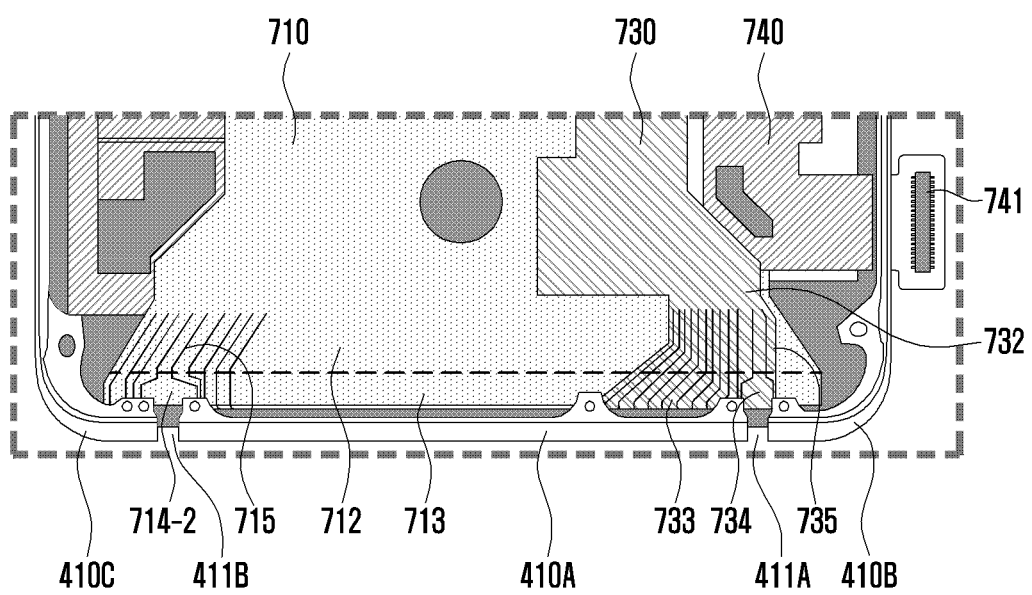
FIG. 7B is a view of a display module at a part adjacent to a frame according to an embodiment of the disclosure.

FIG. 7A is an exploded perspective view of a display module at a part adjacent to a frame according to an embodiment of the disclosure. FIG. 7B is a view of a display module at a part adjacent to a frame according to an embodiment of the disclosure.

According to various embodiments, the frame 410 may be segmented by at least one segmentation part 411. For example, referring to FIG. 7A, the frame 410 may be segmented into the first frame 410A and the second frame 410B by a first segmentation part 411A and may be segmented into the first frame 410A and the third frame 410C by a second segmentation part 411B. In an embodiment, an insulating member (e.g., the insulating member 420 in FIG. 4A) may be disposed at the segmentation part 411.

In an embodiment, a part of a display module (e.g., the display module 600 in FIG. 6A) may be disposed in the electronic device (e.g., the electronic device 400 in FIG. 4A) at the position adjacent to the first frame 410A, the second frame 410B, and the third frame 410C. For example, referring to FIGS. 7A and 7B, the first substrate member 710, the second substrate member 730, and the metal sheet layer 720 may be arranged at the position adjacent to the frame 410.

The first substrate member 710 may be, for example, the first substrate member 500 described in FIG. 4A. The first substrate member 710 may be formed of a flexible material. The first substrate member 710 may include a first part 711, a second part 712, and a first bending part 713 for bendably connecting the first part 711 and the second part 712

In an embodiment, the first part 711 of the first substrate member 710 may be electrically connected to a display panel (e.g., the display panel 630 in FIG. 6A). In one embodiment, a DDI (e.g., the DDI 701 in FIG. 6B) for operating the display panel may be disposed in the first part 711. The second part 712 may be disposed on the rear surface of the display panel by the first bending part 713.

In an embodiment, a wire 715 disposed on the first substrate member 710 may be disposed not to pass through a first area 714-1 of the first bending part 713 adjacent to the first segmentation part 411A between the first frame 410A and the second frame 410B. The wire 715 disposed on the first substrate member 710 may be disposed not to pass through a first area 714-2 of the first bending part 713 adjacent to the second segmentation part 411B between the first frame 410A and the third frame 410C. As illustrated in FIG. 7A, the wire 715 may not pass through the first area 714-1 and 714-2 of the first bending part 713. For example, the wire 715 may be partially bent at a part adjacent to the first area 714-1 and 714-2 so that the wire 715 can extend to avoid the first area 714-1 and 714-2.

According to various embodiments, when the display module is disposed in the electronic device, the metal sheet layer 720 may be disposed between the first substrate member 710 and the display panel. The metal sheet layer 720 may have an opening provided at a second area 721-1 adjacent to the first segmentation part 411A. The metal sheet layer 720 may have an opening provided at a second area 721-2 adjacent to the second segmentation part 411B. The metal sheet layer 720 is formed of a conductive material but a part of the metal sheet layer 720, the part being adjacent to the area having the segmentation part 411 formed therein, is eliminated, and thus a coupling phenomenon between the frames segmented by the metal sheet layer 720 can be decreased.

According to various embodiments, the second substrate member 730 may be electrically connected to the display panel. Similar to the first substrate member 710, the second substrate member 730 may also be formed of a flexible material. The second substrate member 730 may include a third part 731, a fourth part 732, and a second bending part 733 for bendably connecting the third part 731 and the fourth part 732. The third part 731 may be electrically connected to the display panel and the fourth part 732 may be disposed to extend to the rear surface of the display panel by the second bending part 733. In an embodiment, the second substrate member 730 may include a wire 735 for transmitting a touch signal of the display panel.

In an embodiment, in the second bending part 733 of the second substrate member 730, the wire 735 may be disposed not to pass through a third area 734 adjacent to the first segmentation part 411A between the first frame 410A and the second frame 410B. As illustrated in FIG. 7A, the wire 735 may not pass through the third area 734 of the second bending part 733. For example, the wire 735 is partially bent at a part adjacent to the third area 734, and thus can extend to avoid the third area 734.

Likewise, an electrical object adjacent to a part in which the segmentation part 411 is positioned avoids a part adjacent to the segmentation part 411, and thus the degradation of radiation or reception of two frames segmented by the electrical object can be reduced.

Figure 8A:
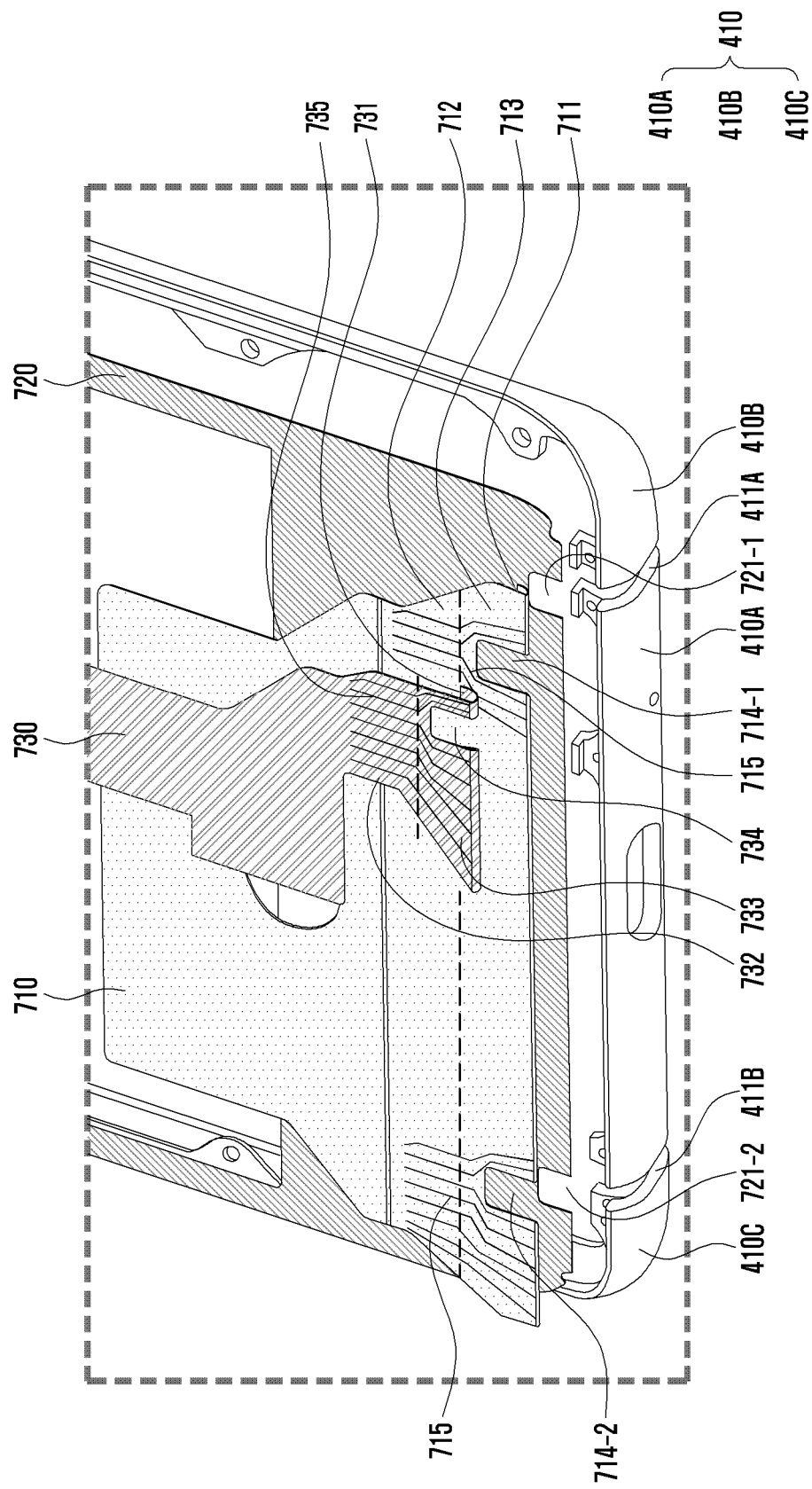
FIG. 8A is an exploded perspective view of a display module at a part adjacent to a frame according to an embodiment of the disclosure.
Figure 8B:
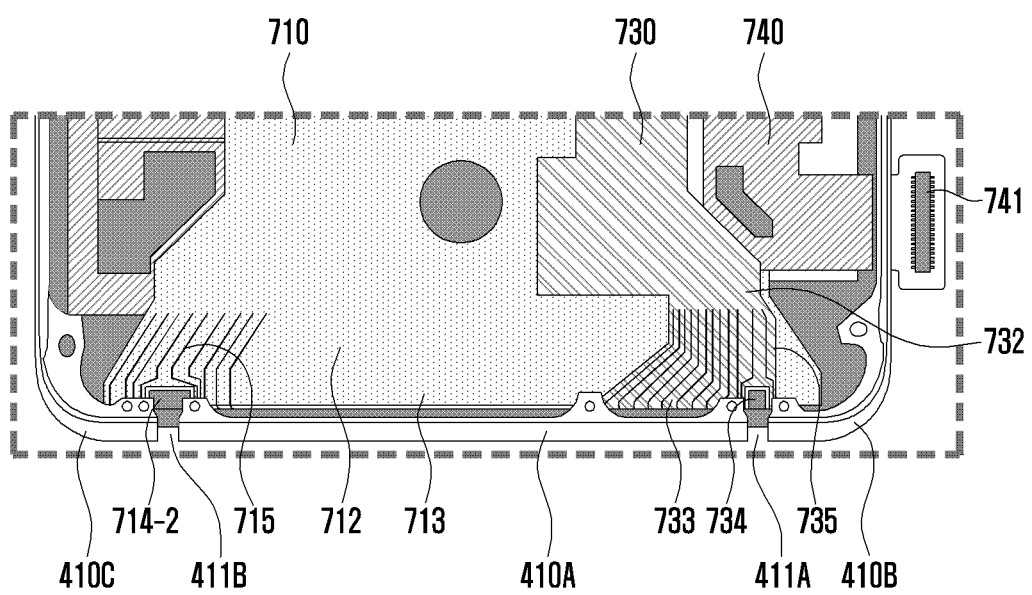
FIG. 8B is a view of a display module at a part adjacent to a frame according to an embodiment of the disclosure.

FIG. 8A is an exploded perspective view of a display module at a part adjacent to a frame according to an embodiment of the disclosure. FIG. 8B is a view of a display module at a part adjacent to a frame according to an embodiment of the disclosure.

An embodiment described through FIGS. 8A and 8B is similar to the embodiment described through FIGS. 7A and 7B, and thus the same components will be denoted by the same reference numerals, a redundant description thereof will be omitted, and different points will be mainly described.

Referring to FIGS. 8A and 8B, the first substrate member 710 may have an opening formed at the first area 714-1 adjacent to the first segmentation part 411A and/or the first area 714-2 adjacent to the second segmentation part 411B. The opening is formed at the first area 714-1 and 714-2, and thus the wire 715 disposed at the first substrate member 710 may not pass through the first area 714-1 and 714-2. The second substrate member 730 may have an opening formed at the third area 734 adjacent to the first segmentation part 411A. The opening is formed at the third area 734, and thus the wire 735 disposed at the second substrate member 730 may not pass through the third area 734.

The structure of the first substrate member 710, the structure of the second substrate member 730, and the structure of the metal sheet layer 720 described above may be identically or similarly applied to various types of electronic devices. For example, the electronic device may include a structure where a first mechanical element and a second mechanical element are movably coupled. For example, the electronic device may include a structure where the second mechanical element slides, is rolled, or is folded with respect to the first mechanical element.

In the structure where the first mechanical element and the second mechanical element move relative to each other, the first substrate member 710, the second substrate member 730, and the metal sheet layer 720 may be fixed to the first mechanical element or the second mechanical element to be moved together with same according to the movement of the first mechanical element or the second mechanical element.

For example, the second mechanical element may move with respect to the first mechanical element, and the first substrate member 710, the second substrate member 730, and the metal sheet layer 720 may be fixed to the second mechanical element to move together with same. A part of the first substrate member 710, the second substrate member 730, and the metal sheet layer 720 may be disposed adjacent to the segmentation part or the insulating member according to the movement state (e.g., folded state, sliding state, rolling state) of the second mechanical element with respect to the first mechanical element.

For example, area A of the first substrate member 710, the second substrate member 730, and the metal sheet layer 720 may be adjacent to the first insulating member in a state where the second mechanical element has not moved with respect to the first mechanical element. The structure described above, such as a structure where the wire formed of a conductive material passes for avoidance and/or a structure of having an opening, may be applied to this area A. Area B of the first substrate member 710, the second substrate member 730, and the metal sheet layer 720 may be adjacent to a second insulating member positioned at a part different from the first insulating member in a state where the second mechanical element has moved with respect to the first mechanical element. Area B may be understood as an area different from area A. In summary, area B may be an area which becomes adjacent to the segmentation part or the insulating member according to the movement of the second mechanical element. In one embodiment, the structure described above, for example, the structure where the wire formed of a conductive material passes for avoidance and/or the structure of having an opening, may also be applied to area B of the first substrate member 710, the second substrate member 730, and the metal sheet layer 720.

The structure where the second mechanical element moves with respect to the first mechanical element to prevent an electrical object from being adjacent to the part overlapping the insulating member is applied so that the frame segmented by the insulating member can radiate or receive a communication signal with a designated quality even where a user deforms the electronic device into various shapes.

Hereinafter, the description described above will be described in more detail through an example of the electronic device including the second mechanical element installed to be movable with respect to the first mechanical element.

Figure 9A:
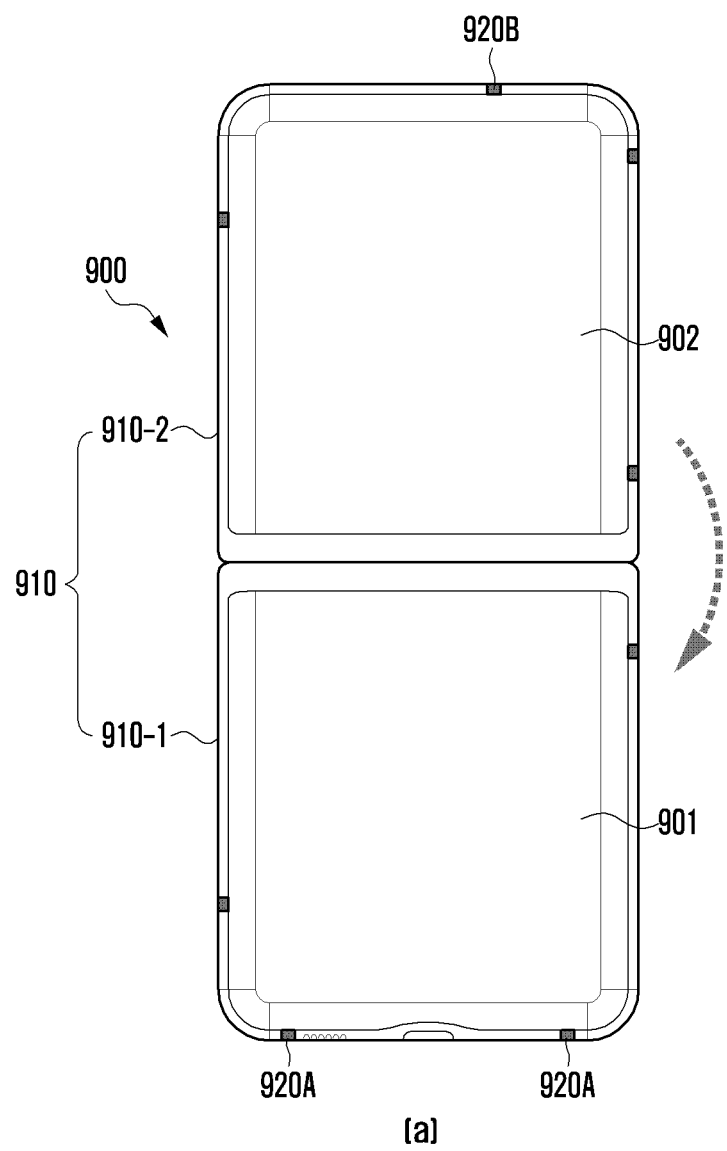
FIGS. 9A and 9B are views of an electronic device according to an embodiment of the disclosure.
Figure 9B:
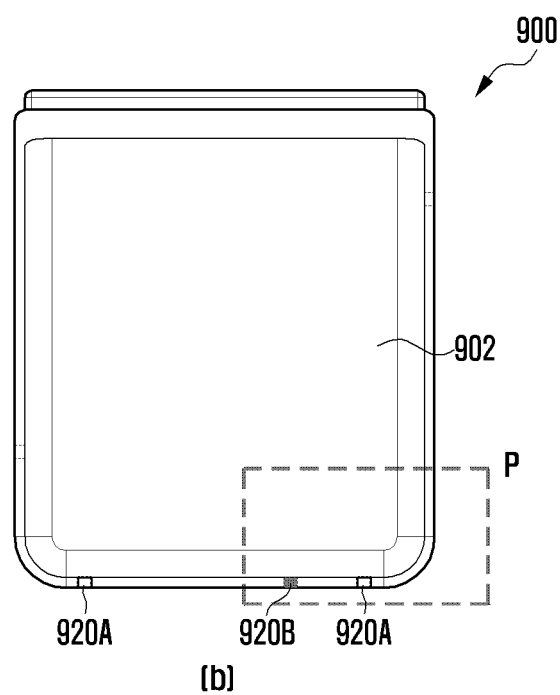
Figure 10:
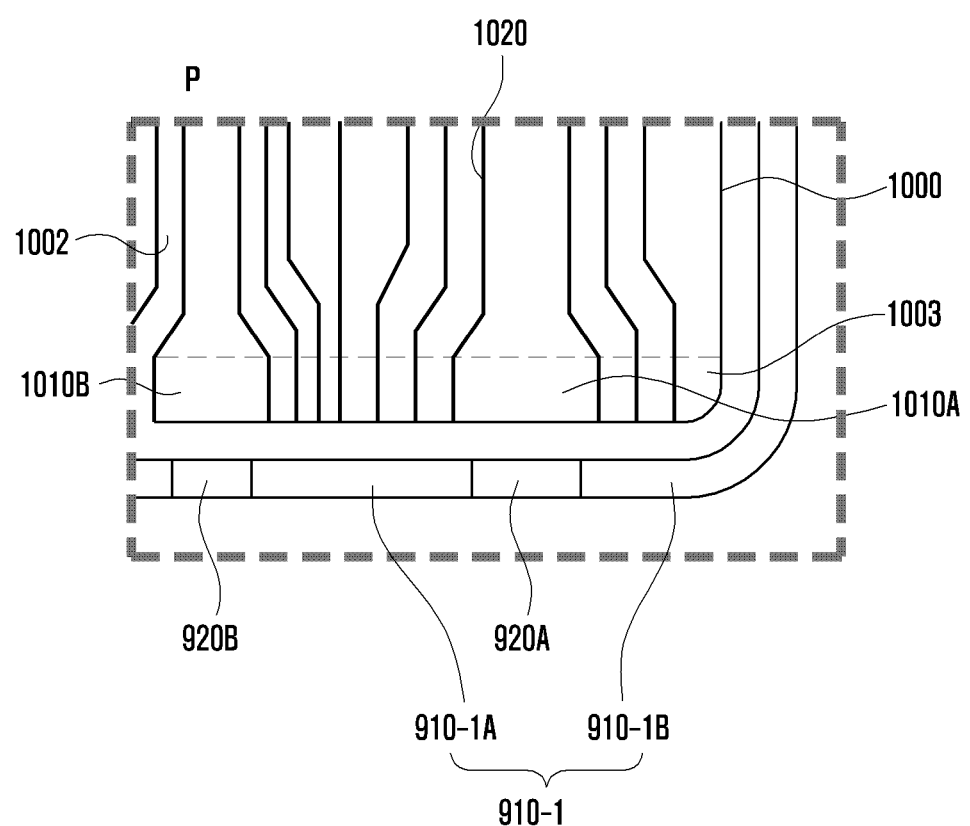
FIG. 10 is a diagram illustrating the area P in FIG. 9B according to an embodiment of the disclosure.

FIGS. 9A and 9B are views of an electronic device according to an embodiment of the disclosure. FIG. 10 is a diagram illustrating area P in FIG. 9B according to an embodiment of the disclosure.

An electronic device 900 illustrated in FIGS. 9A and 9B may be an example of the electronic device 101 described in FIG. 1. In an embodiment, the electronic device 900 may include a first housing 901 and a second housing 902 foldably connected with respect to the first housing 901. The first housing 901 may be understood as the first mechanical element described above, and the second housing 902 may be understood as the second mechanical element. Hereinafter, a frame (e.g., the frame 410 in FIG. 4A) of the electronic device included in the first housing 901 will be described as a first frame 910-1, and a frame included in the second housing 902 will be described as a second frame 910-2. The frames 910-1 and 910-2 may be formed of a conductive material to function as an antenna radiator 910.

In an embodiment, the first frame 910-1 and the second frame 910-2 may be segmented into a plurality of parts by segmentation parts (e.g., the segmentation part 411 in FIG. 7A), respectively. In one embodiment, an insulating member (e.g., the insulating member 420 in FIG. 4A) formed of an insulating material may be disposed in the segmentation part. In the description below, the insulating member disposed in the segmentation part formed at the first frame 910-1 will be described as a first insulating member 920A and the insulating member disposed in the segmentation part formed at the second frame 910-2 will be described as the second insulating member 920B.

When an electrical object is disposed in area P in FIG. 9B, the first insulating member 920A disposed in the segmentation part of the first frame 910-1 may be adjacent to the electrical object in an unfolded state where the first housing 901 and the second housing 902 are unfolded as illustrated in FIG. 9A. As illustrated in FIG. 9B, the electrical object disposed in area P may be disposed to be adjacent to the first insulating member 920A and the second insulating member 920B disposed in the segmentation parts of the second frame 910-2 in a state where the first housing 901 and the second housing 902 are folded.

Referring to FIG. 10, a first substrate member 1000 (e.g., the first substrate member 500 in FIG. 4B) may include a first sub-area 1010A adjacent to the first insulating member 920A and a second sub-area 1010B adjacent to the second insulating member 920B. The first sub-area 1010A and the second sub-area 1010B may be an area similar to the first area 510 in FIG. 4B. In a state illustrated in FIG. 9A (hereinafter, referred to "unfolded state"), the first substrate member 1000 may be adjacent to the first insulating member 920A. In a state illustrated in FIG. 9B (hereinafter, referred to "folded state"), the first substrate member 1000 may be adjacent to the first insulating member 920A and the second insulating member 920B. The first sub-area 1010A and the second sub-area 1010B may be different areas.

According to various embodiments, the first substrate member 1000 may include a first bending part 1003 (e.g., the first bending part 503 in FIG. 5A) for bendably connecting a first part (not illustrated) (e.g., the first part 501 in FIG. 5A) connected to a display panel (e.g., the display panel 630 in FIG. 6A) of a display module (e.g., the display module 600 in FIG. 6A) and a second part 1002 (e.g., the second part 502 in FIG. 5A) spaced apart from the first part. In an embodiment, the first sub-area 1010A and the second sub-area 1010B may be an area positioned at the first bending part 1003 of the first substrate member 1000.

In an embodiment, a plurality of wires (1020) arranged at the first substrate member 1000 may not be arranged in the first sub-area 1010A and the second sub-area 1010B. Referring to FIG. 10, the plurality of wires 1020 may be partially bent at a part adjacent to the first sub-area 1010A and the second sub-area 1010B to extend to avoid the first sub-area 1010A and the second sub-area 1010B.

When the electronic device in the unfolded state, an electrical object is not disposed in the first sub-area 1010A adjacent to the first insulating member 920A and thus a first sub-frame 910-1A and a second sub-frame 910-1B which are segmented by the first insulating member 920A can transmit or receive a communication signal with a designated quality. When the electronic device is in the folded state, an electrical object is not disposed even in the second sub-area 1010B adjacent to the second insulating member 920B and thus the second frame 910-2 segmented into a plurality of parts by the second insulating member 920B can transmit or receive a communication signal with a designated quality.

In another embodiment, similar to the illustration in FIG. 4B, the first sub-area 1010A and the second sub-area 1010B may be openings formed at the first substrate member 1000. When the first sub-area 1010A and the second sub-area 1010B are openings, the wire 1020 disposed at the first substrate member 1000 cannot pass through the first sub-area 1010A and the second sub-area 1010B, and thus an electrical object may not be adjacent to the first insulating member 920A or the second insulating member 920B.

Hereinafter, the description refers to the description in FIGS. 7A and 7B, and FIGS. 8A and 8B with respect to the structure of the metal sheet layer and the second substrate member.

The structure of the first substrate member 1000 described above may be similarly applied to a metal sheet layer (e.g., the metal sheet layer 720 in FIG. 7A) and/or a second substrate member (e.g., the second substrate member 730 in FIG. 7A). For example, the metal sheet layer may include a third sub-area adjacent to the first insulating member 920A and a fourth sub-area adjacent to the second insulating member 920B. The third sub-area and the fourth sub-area of the metal sheet layer may be openings formed at the metal sheet layer. For example, the third sub-area and the fourth sub-area may be areas corresponding to the second area 721-1 and 721-2 in FIG. 7A.

The second substrate member (e.g., the second substrate member 730 in FIG. 7A) may include a second bending part (e.g., the second bending part 733 in FIG. 7A) for bendably connecting a third part (e.g., the third part 731 in FIG. 7A) connected to the display panel and a fourth part (e.g., the fourth part 732 in FIG. 7A) spaced apart from the third part. The second bending part of the second substrate member may include a fifth sub-area and a sixth sub-area. The fifth sub-area may be an area adjacent to the first insulating member 920A, and the sixth sub-area may be an area adjacent to the second insulating member 920B. For example, the fifth sub-area and the sixth sub-area may be areas corresponding to the third area 734-1 and 734-2 of the second substrate member described in FIG. 7A. The plurality of wires (e.g., the wire 735 in FIG. 7A) arranged at the second substrate member may be arranged not to pass through the fifth sub-area and the sixth sub-area. For example, similar to the wire (1020) of the first substrate member 1000 which passes through the first sub-area 1010A and the second sub-area 1010B, the wire disposed at the second substrate member may extend to be bent at the part adjacent to the fifth sub-area and the sixth sub-area. The fifth sub-area and the sixth sub-area of the second substrate member may be openings formed at the second substrate member.

An electronic device (e.g., the electronic device in FIG. 4A) according to various embodiments disclosed herein may include a frame (e.g., the frame 410 in FIG. 4A) which is formed of a conductive material and at least a part of which forms a lateral exterior of the electronic device, a segmentation part (e.g., the segmentation part 411 in FIG. 7A) formed at the frame to segment the frame into a plurality of parts, and a first substrate member (e.g., the first substrate member 500 in FIG. 4B) including a first part (e.g., the first part 501 in FIG. 4B) and a second part (e.g., the second part 502 in FIG. 4B) which are spaced apart from each other, and a first bending part (e.g., the first bending part 503 in FIG. 4B) for bendably connecting the first part and the second part, wherein a plurality of wires (e.g., the wire 520 in FIG. 4B) arranged in the first substrate member may be arranged not to pass through a first area (e.g., the first area 510 in FIG. 4B) which is an area of the first bending part of the first substrate member and is adjacent to the segmentation part.

In addition, an insulating member (e.g., the insulating member 420 in FIG. 4A) formed of an insulating material and disposed at the segmentation part may be further included therein.

The plurality of wires arranged at the first substrate member may extend to be bent at the part adjacent to the first area not to pass through the first area.

The first area of the first substrate member may be an opening formed at the first substrate member.

In the first substrate member, the first part may be electrically connected to a display panel (e.g., the display panel 630 in FIG. 6A) and the first bending part may be bent to position the second part at the rear surface of the display panel.

A display driver IC (DDI) 701 (e.g., the DDI in FIG. 6A) for controlling the operation of the display panel may be disposed at the first part of the first substrate member.

A metal sheet layer (e.g., the metal sheet layer 720 in FIG. 7A) disposed between the first substrate member and the display panel may be further included therein, and the metal sheet layer may include an opening formed at a second area (e.g., the second area 721-1 in FIG. 7A) which is an area adjacent to the segmentation part.

A second substrate member (e.g., the second substrate member 730 in FIG. 7A) electrically connected to the display panel may be further included therein, wherein the second substrate member may include a third part (e.g., the third part 731 in FIG. 7A) connected to the display panel, a fourth part (e.g., the fourth part 732 in FIG. 7A) spaced apart from the third part, and a second bending part (e.g., the second bending part 733 in FIG. 7A) for bendably connecting the third part and the fourth part, and the plurality of the wires (e.g., the wire 735 in FIG. 7A) arranged at the second bending part may be arranged not to pass through the third area which is an area adjacent to the segmentation part.

The plurality of wires arranged at the second bending part may extend to be bent at the part adjacent to the third area not to pass through the third area of the second substrate member.

The third area of the second substrate member may be an opening formed at the second substrate member.

An electronic device (e.g., the electronic device 900 in FIGS. 9A and 9B) according to various embodiments disclosed herein may include a first mechanical element (e.g., the first housing 901 in FIG. 9A), a second mechanical element (e.g., the second housing 902 in FIGS. 9A and 9B) moving with respect to the first mechanical element, a frame including a first frame (e.g., the first frame 910-1 in FIG. 9A) formed of a conductive material and coupled to the first mechanical element and a second frame (e.g., the second frame 910-2 in FIG. 9A) formed of a conductive material and coupled to the second mechanical element, a segmentation part (e.g., the segmentation part 411 in FIG. 7A) formed at the frame to segment each of the first frame and the second frame into a plurality of parts, a first substrate member (e.g., the first substrate member 1000 in FIG. 10) which includes a first part (e.g., the first part 501 in FIG. 5A) and a second part (e.g., the second part 1002 in FIG. 10) spaced apart from each other, and a first bending part (e.g., the first bending part 1003 in FIG. 10) for bendably connecting the first part and the second part and is disposed to move together with at least one of the first mechanical element and the second mechanical element, wherein a plurality of wires (e.g., the wire 1020 in FIG. 10) arranged at the first substrate may be arranged not to pass through a first area which is an area of a first bending part of the first substrate member and is adjacent to the segmentation part.

An insulating member formed of an insulating material and disposed at the segmentation part may be further included therein.

The insulating member may include a first insulating member (e.g., the first insulating member 920A in FIGS. 9A and 9B) disposed at the segmentation part formed at the first frame and a second insulating member (e.g., the second insulating member 920B in FIGS. 9A and 9B) disposed at the segmentation part formed at the second frame.

The first area of the first substrate member may include a first sub-area (e.g., the first sub-area 1010A in FIG. 10) adjacent to the first insulating member and a second sub-area (e.g., the second sub-area 1010B in FIG. 10) adjacent to the second insulating member in a state where the second mechanical element rotates with respect to the first mechanical element to be folded.

The plurality of wires (e.g., the wire 1020 in FIG. 10) arranged at the first substrate member may extend to be bent at the part adjacent to the first sub-area not to pass through the first sub-area and may extend to be bent at the part adjacent to the second sub-area not to pass through the second sub-area.

At least one of the first sub-area and the second sub-area of the first substrate member may be an opening formed at the first substrate member.

A metal sheet layer (e.g., the metal sheet layer 720 in FIG. 7A) disposed between the first substrate member and the display panel may be further included therein, and the metal sheet layer may include a third sub-area adjacent to the first insulating member and the fourth sub-area adjacent to the second insulating member in a state where the second mechanical element rotates with respect to the first mechanical element to be folded, wherein the third sub-area and the fourth sub-area may be openings formed at the metal sheet layer.

A second substrate member (e.g., the second substrate member 730 in FIG. 7A) electrically connected to the display panel may be further included therein, and the second substrate member may include a third part (e.g., the third part 731 in FIG. 7A) connected to the display panel, a fourth part (e.g., the fourth part 732 in FIG. 7A) spaced apart from the third part, and a second bending part (e.g., the second bending part 733 in FIG. 7A) bendably connecting the third part and the fourth part, wherein the second bending part may include a fifth sub-area adjacent to the first insulating member and a sixth sub-area adjacent to the second insulating member in a state where the second mechanical element rotates with respect to the first mechanical element to be folded, and a plurality of wires (e.g., the wire 735 in FIG. 7A) arranged at the second bending part may be arranged not to pass through the fifth sub-area and the sixth sub-area The plurality of wires arranged at the second bending part may extend to be bent at the parts adjacent to the fifth sub-area and the sixth sub-area not to pass through the fifth sub-area and the sixth sub-area, respectively.

The fifth sub-area and the sixth sub-area of the second substrate member may be openings formed at the second substrate member.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. An electronic device comprising:
    a frame formed of a conductive material, wherein at least a portion of the frame forms a lateral exterior of the electronic device;
    a segmentation part formed at the frame so as to segment the frame into a plurality of parts;
    a first substrate member comprising a first part and a second part which are spaced apart from each other, and a first bending part configured to bendably connect the first part and the second part; and
    a plurality of wires arranged in the first substrate member,
    wherein the plurality of wires arranged in the first substrate member is arranged not to pass through a first area which is an area of the first bending part of the first substrate member and is adjacent to the segmentation part, and
    wherein the first bending part is disposed closer to at least a portion of the lateral exterior of the electronic device than the first part and the second part.

2. The electronic device of claim 1, further comprising:
    an insulating member formed of an insulating material and disposed at the segmentation part.

3. The electronic device of claim 1, wherein the plurality of wires arranged at the first substrate member extend to be bent at the part adjacent to the first area so as not to pass through the first area.

4. The electronic device of claim 3, wherein the first area of the first substrate member is an opening formed at the first substrate member.

5. The electronic device of claim 3, wherein the first substrate member has the first part electrically connected to a display panel and the first bending part bent to position the second part at a rear surface of the display panel.

6. The electronic device of claim 5, further comprising:
    a display driver integrated circuit (IC) (DDI) configured to control the display panel, the DDI being disposed at the first part of the first substrate member.

7. The electronic device of claim 5, further comprising:
    a metal sheet layer disposed between the first substrate member and the display panel,
    wherein the metal sheet layer comprises an opening formed at a second area which is an area adjacent to the segmentation part.

8. The electronic device of claim 5, further comprising:
    a second substrate member electrically connected to the display panel,
    wherein the second substrate member comprises a third part connected to the display panel, a fourth part spaced apart from the third part, and a second bending part for bendably connecting the third part and the fourth part, and
    wherein the plurality of the wires arranged at the second bending part are arranged not to pass through a third area which is an area adjacent to the segmentation part.

9. The electronic device of claim 8, wherein the plurality of wires arranged at the second bending part extend to be bent at the part adjacent to the third area not to pass through the third area of the second substrate member.

10. The electronic device of claim 9, wherein the third area of the second substrate member is an opening formed at the second substrate member.

11. An electronic device comprising:
    a first mechanical element;
    a second mechanical element configured to move with respect to the first mechanical element;

a frame comprising a first frame formed of a conductive material and coupled to the first mechanical element and a second frame formed of a conductive material and coupled to the second mechanical element, wherein at least a portion of the frame forms a lateral exterior of the electronic device;

a segmentation part formed at the frame to segment each of the first frame and the second frame into a plurality of parts;

a first substrate member which comprises a first part and a second part spaced apart from each other, and a first bending part for bendably connecting the first part and the second part, the first bending part being disposed to move together with at least one of the first mechanical element and the second mechanical element; and a plurality of wires arranged at the first substrate member, wherein the plurality of wires arranged at the first substrate member are arranged not to pass through a first area which is an area of the first bending part of the first substrate member and is adjacent to the segmentation part, and wherein the first bending part is disposed closer to at least a portion of the lateral exterior of the electronic device than the first part and the second part.

12. The electronic device of claim 11, further comprising: an insulating member formed of an insulating material and disposed at the segmentation part.

13. The electronic device of claim 12, wherein the insulating member comprises:

a first insulating member disposed at the segmentation part formed at the first frame; and a second insulating member disposed at the segmentation part formed at the second frame.

14. The electronic device of claim 13, wherein the first area of the first substrate member comprises a first sub-area adjacent to the first insulating member and a second sub-area adjacent to the second insulating member in a state where the second mechanical element rotates with respect to the first mechanical element to be folded, and wherein the first substrate member has the first part electrically connected to a display panel.

15. The electronic device of claim 14, wherein the plurality of wires arranged at the first substrate member extend to be bent at a part adjacent to the first sub-area not to pass through the first sub-area and extend to be bent at a part adjacent to the second sub-area not to pass through the second sub-area.

16. The electronic device of claim 14, wherein at least one of the first sub-area and the second sub-area of the first substrate member is an opening formed at the first substrate member.

17. The electronic device of claim 14, further comprising:

a metal sheet layer disposed between the first substrate member and the display panel, wherein the metal sheet layer comprises a third sub-area adjacent to the first insulating member and a fourth sub-area adjacent to the second insulating member in a state where the second mechanical element rotates with respect to the first mechanical element to be folded, and wherein the third sub-area and the fourth sub-area are openings formed at the metal sheet layer.

18. The electronic device of claim 14, further comprising:

a second substrate member electrically connected to the display panel, wherein the second substrate member comprises a third part connected to the display panel, a fourth part spaced apart from the third part, and a second bending part for bendably connecting the third part and the fourth part, wherein the second bending part comprises a fifth sub-area adjacent to the first insulating member and a sixth sub-area adjacent to the second insulating member in a state where the second mechanical element rotates with respect to the first mechanical element to be folded, and wherein the plurality of wires arranged at the second bending part are arranged not to pass through the fifth sub-area and the sixth sub-area.

19. The electronic device of claim 18, wherein the plurality of wires arranged at the second bending part extend to be bent at the parts adjacent to the fifth sub-area and the sixth sub-area not to pass through the fifth sub-area and the sixth sub-area, respectively.

20. The electronic device of claim 18, wherein the fifth sub-area and the sixth sub-area of the second substrate member are openings formed at the second substrate member.

* * * * *